(12) United States Patent
Pinho-Meneses et al.

(10) Patent No.: US 11,959,985 B2
(45) Date of Patent: Apr. 16, 2024

(54) STATIC-MAGNETIC-FIELD SHIMMING COIL SYSTEM FOR MAGNETIC RESONANCE IMAGING

(71) Applicant: COMMISSARIAT A L'ENERGIE ATOMIQUE ET AUX ENERGIES ALTERNATIVES, Paris (FR)

(72) Inventors: Bruno Pinho-Meneses, Gif-sur-Yvette (FR); Alexis Amadon, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/603,915

(22) PCT Filed: Apr. 16, 2020

(86) PCT No.: PCT/EP2020/060649
§ 371 (c)(1),
(2) Date: Oct. 14, 2021

(87) PCT Pub. No.: WO2020/212463
PCT Pub. Date: Oct. 22, 2020

(65) Prior Publication Data
US 2022/0236350 A1 Jul. 28, 2022

(30) Foreign Application Priority Data
Apr. 19, 2019 (EP) .................................. 19315024

(51) Int. Cl.
*G01R 33/3875* (2006.01)
(52) U.S. Cl.
CPC ................................ *G01R 33/3875* (2013.01)
(58) Field of Classification Search
CPC .................................................. G01R 33/3875
See application file for complete search history.

(56) References Cited

U.S. PATENT DOCUMENTS

2010/0268514 A1* 10/2010 Liu ...................... G01R 33/385
703/2
2016/0178718 A1* 6/2016 Bindseil ............... G01R 33/385
324/322

OTHER PUBLICATIONS

Poole, Improved Equipment and Techniques for Dynamic Shimming in High Field MRI, Dissertation, The University of Nottingham, 2007 (Year: 2007).*

(Continued)

*Primary Examiner* — Daniel R Miller
(74) *Attorney, Agent, or Firm* — BakerHostetler

(57) ABSTRACT

A method of designing/manufacturing a static-magnetic-field shimming coil system for magnetic resonance imaging, includes determining an optimal stream function, defined on a reference surface enclosing a region of interest, for each member of a cohort of magnetic resonance imaging subjects; performing a Principal Component Analysis of the stream functions; determining at least one coil wiring pattern defined on the reference surface by discretizing at least a most significant principal component of the stream functions. A static-magnetic-field shimming coil system suitable to be obtained by the method at least one hollow dielectric support element having a cavity containing the region of interest and a surface having a shape corresponding to the reference surface or, where appropriate, one the additional surface; and a set of conducting elements deposed on or affixed to the surface of the dielectric support, forming the or one the coil wiring pattern.

19 Claims, 11 Drawing Sheets

(56) References Cited

OTHER PUBLICATIONS

Michael Poole et al., 2010 J. Phys. D: Appl. Phys. 43 095001 (Year: 2010).*

Smith et al., The Coil Array Method for Creating a Dynamic Imaging Volume, Magnetic Resonance in Medicine 78:784-793, 2017 ( Year: 2017).*

Salomir, et al., "A Fast Calculation Method for Magnetifc Field Inhomogeneity due to an Arbitrary Distribution of Bulk Susceptibility", Concepts in Magn. Reson., vol. 19B(1), pp. 26-34, 2003.

Juchem, et al., "Dynamic multi-coil technique (DYNAMITE) shimming for echo-planar imaging of the human brain at 7 Tesla", NeuroImage, vol. 105, pp. 462-472, 2015.

Stockmann, et al., "In Vivo B0 shimming methods for MRI at 7T", NeuroImage, vol. 168, pp. 71-87, 2018.

Kim, et al., "Gradient-Echo EPI Using a High-Degree Shim Insert Coil at 7T: Implications for BOLD fMRI", Magnetic Resonance in Medicine, vol. 78, pp. 1734-1745, 2017.

Vedrine, et al., "Manufacturing of the Iseult/INUMAC Whole Body 11.7 T MRI Magnet", IEEE Transactions On Applied Superconductivity, vol. 24, No. 3, Jun. 2014.

Windischberger, et al., "Robust Field Map Generation Using a Triple-Echo Acquisition", Journal of Magnetic Resonance Imaging, vol. 20, pp. 730-731, 2004.

Peeren, et al., "Stream Function Approach for Determining Optimal Surface Currents", Journal of Computational Physics, vol. 191, p. 305, 2003.

Poole, et al., "Novel gradient coils designed using a boundary element method", Concepts Magn. Reson., vol. 31B (3), pp. 162-175, 2007.

Lemdiasov, et al., "A stream function method for gradient coil design", Concepts Magn. Reson., vol. 26B(1), pp. 67-80, 2005.

Brideson, et al., "Determining complicated winding patterns for shim coils using stream functions and the target-field method", Concepts in Magnetic Resonance, vol. 14, No. 1, pp. 9-18, 2001.

Li, et al., "Decomposition of off-resonance fields in brain MRI", Proc. Intl. Soc. Mag. Reson. Med., No. 4315, 2018.

* cited by examiner

STATIC-MAGNETIC-FIELD SHIMMING COIL SYSTEM FOR MAGNETIC RESONANCE IMAGING

CROSS-REFERENCE TO RELATED APPLICATIONS

This application is a National Stage of International patent application PCT/EP2020/060649, filed on Apr. 16, 2020, which claims priority to foreign European patent application No. EP 19315024.0, filed on Apr. 19, 2019, the disclosures of which are incorporated by reference in their entirety.

The invention relates to a method for designing and manufacturing a static-magnetic-field shimming coil system ("$B_0$ shimming" for short) for magnetic resonance imaging (MRI), to such a coil system and to a MRI apparatus comprising such a coil system.

Successful data acquisition and good image quality in Magnetic Resonance Imaging (MRI) are dependent on main static magnetic field ($B_0$) homogeneity. The $B_0$ field is generated by a superconductive magnet and is directed in the Oz axis. It induces a net magnetization of nuclear spins, which precess around the field direction. The primary nucleus of interest in MRI is that of the hydrogen atom, the proton, mostly spread in water molecules of living tissues.

The natural precession frequency is proportional to the magnetic field and gyromagnetic ratio $\gamma$ for the proton:

$$f_0 = \gamma B_0$$

with $\gamma$ equal to 42.58 MHz/T.

To form an image, three gradient fields $$\left( G_X = \frac{\partial B_z}{\partial x}, G_y = \frac{\partial B_z}{\partial y}, G_Z = \frac{\partial B_z}{\partial z} \right)$$

can be added to the main static field, each generated by an independently driven coil. They produce linearly varying spatial frequency distributions in the anatomy being imaged, providing spatial encoding that will permit image reconstruction.

Since the image depends on spatial frequency distribution, if the main field is not uniform as expected, reconstruction will be performed incorrectly, presenting geometric distortion of the anatomy. In addition, localized uncontrolled peak field gradients may cause signal loss due to intra-voxel dephasing in long echo-time Gradient-Echo acquisition sequences.

In particular, the Echo Planar Imaging sequence (EPI) is strongly affected by non-uniform $B_0$ field. In addition, spectroscopy loses chemical species resolution as the main field becomes non-uniform.

Although $B_0$ field magnets are designed to produce very homogeneous fields, down to fractions of ppm (part per million), fabrication imperfections cause it to deviate from desired homogeneity, demanding a compensation system to be set in place. Homogenization of the $B_0$ field is then performed by placing metal pieces in strategic locations and using a set of shim coils generating orthogonal spherical harmonic (SH) fields of different orders and degrees. Mathematically, the procedure consists of zeroing-out as much spherical harmonics components of order $\ell > 0$ of the expansion in spherical harmonics (EHS) as possible under engineering constraints (space, power consumption, feasibility . . . ). Thus, uniformity of the main field is guaranteed inside a pre-defined useful imaging region or Zone of Interest (ZI).

$$B_0(r, \theta, \phi) = \sum_{\ell=0}^{+\infty} \sum_{m=-\ell}^{\ell} C_{\ell,m} r^\ell Y_{\ell,m}(\theta, \phi) \quad (1)$$

This homogenization procedure is performed during install and calibration without patients in the imaging region. However, once a subject is put into the scanner, magnetic susceptibility gradients between air and brain tissue will cause field fluctuations inside the brain according to equation [adapted from Salomir 2003]:

$$\nabla^2 B_z = \left( \nabla^2 \chi - 3 \frac{\partial^2 \chi}{\partial z^2} \right) B_0 \quad (2)$$

$\chi$ being the magnetic susceptibility.

The fluctuations are, thus, directly proportional to the main magnetic field.

Field variations due to magnetic susceptibility gradients inside the brain are more intense in the pre-frontal cortex, which is close to sinus and mouth, and in the temporal lobes, which are close to the ear canals.

A non-homogeneous magnetic field pattern $\Delta B_0(\vec{x}) = B_{br}(\vec{x}) - B_0$, with $\vec{x} = x\hat{x} + y\hat{y} + z\hat{z}$, will then be produced inside the human brain, with $B_0$ the desired field inside the brain and $B_{br}(\hat{x})$ the actual field inside the brain due to magnetic susceptibility gradients.

A global metric for field inhomogeneity is given by:

$$\sigma(\Delta B_0) = \sqrt{\frac{\sum_{k=1}^{K}(\Delta B_0(\vec{x}_k) - \mu_{\Delta B_0})^2}{K}} \quad (3)$$

with K being the number of control points inside the brain (i.e. voxels or a subset thereof) and $\mu_{\Delta B_0}$ the average $\Delta B_0$ value.

Inhomogeneity values are commonly expressed in Hertz by applying the Larmor relation. For the sake of the presentation, and without loss of generality, the control points will hereby be the centers of all voxels located in the brain when meshed with a given spatial resolution.

For a 1.7-mm isotropic resolution, acceptable levels of inhomogeneity commonly obtained at 3 T are less than 25 Hz. For sequences such as EPI, depending on its parameters, absolute peak values should be less than 100 Hz inasmuch as possible to avoid large geometric distortions.

At Ultra-High Field (UHF), i.e. for magnetic fields of 7 T and more (typically 7 T or 11.7 T), $\Delta B_0$ values are more pronounced inside the brain; so they increase geometric distortion in EPI images, limit spectral resolution (impeding spectroscopy) and enhance signal loss due to intra-voxel dephasing in gradient-echo sequences. Inhomogeneity increases linearly with the magnetic field; after 2nd order shimming, it is typically 67 Hz in a human brain at 7 T and 110 Hz at 11.7 T, still with 1.7-mm resolution.

With the increase of UHF MRI in research and in the market, a performing device is needed to drop inhomogeneity to acceptable levels that will guarantee image quality.

To improve homogeneity after patient insertion, most modern scanners of 3T field or higher possess a set of eight or more coils, independently driven, each one generating an independent SH based field of different order and degree (usually, the 8 coils correspond to first- and second-order shimming, requiring 3 and 5 coils, respectively). A calibration step is performed where a field map of the anatomic region is acquired and used to determine the ideal currents to drive each coil in order to reduce $\sigma(\Delta B_0)$. These dedicated shim coils are usually placed around the gradients and are part of the system provided by the manufacturer.

In-house solutions began to be explored by different research groups to improve image quality in brain imaging at UHF, especially for EPI imaging.

A straightforward approach to improve homogeneity consists in increasing the order of spherical harmonics field terms used for shimming. MRI manufacturers usually provide built-in 2nd order SH coils and may offer optional $3^{rd}$-order coils on their UHF magnets. Nevertheless, for high-quality functional MRI, Diffusion Tensor Imaging, or spectroscopy, these are not sufficient for UHF, thus, smaller, brain dedicated, shim inserts up to fourth or partial fifth order were developed, see e.g. [Kim 2016]. This approach, however, implies the construction of a large number of coils with increasing resistance and inductance as SH order increases.

More recently, the use of non-orthogonal field patterns generated by simple circular loops placed as close as possible to the subject's head started to be explored for shimming. A 48-Channel Multi-Coil array (MCA) composed of regularly distributed circular loops over a cylindrical surface of 28.5 cm diameter was proposed in [Juchem 2015]. The system is versatile and can be used for slice-by-slice shimming as well as for whole brain or "global" shimming, although performance for global shimming is limited for 3D sequences.

Another MCA approach integrating RF signal reception and $B_0$ shimming in the same coils was proposed in [Stockmann 2018], in which the RF receive loops were slightly modified to admit a forced current flow for $B_0$ homogenization while maintaining signal reception. Systems presented in [Juchem 2015] and [Stockmann 2018] showed similar performances.

None of these prior art approaches gives full satisfaction. As already explained, high-order SH coils require too much space. Inhomogeneity reduction from a 2nd-order-shimmed baseline when using a complete 5th-order system is around 20% with 27 coils, each one assembled over a different cylindrical surface that must cover the whole brain.

The MCA approaches are more compact than a SH assembly but also require a high number of independently driven channels, and therefore complex electronics and connectivity.

Overall, the existing $B_0$ shimming techniques show insufficient global inhomogeneity reduction performances at fields significantly exceeding 7 T such as the 11.7 T Iseult project [Vedrine 2014].

The invention aims at overcoming, in full or in part, these drawbacks of the prior art. More particularly, it aims at providing a $B_0$ shimming coil system with small space requirements, requiring a smaller number of channels than the prior art approaches for a given inhomogeneity reduction, or a better inhomogeneity reduction for a same number of channels.

According to the invention, this aim is achieved by computing a set of "optimal" $B_0$ shimming coil wiring patterns, one for each member of a cohort of MRI subjects (i.e. patients), then extracting a small number (e.g. 1 to 7, typically 3 to 5) of principal components of said set. The result is a same number of subject-independent wiring patterns defined on respective surfaces (e.g. cylindrical), disjoint but close to each other, enclosing a region of interest inside which the magnetic field shall be homogenized. In a preferred embodiment of the invention, sub-patterns are identified within each wiring pattern, and the current flowing into each sub-pattern may be optimized for a given patient, resulting in a multi-channel system. The "optimal" $B_0$ shimming coil wiring patterns are computed using the stream function approach, disclosed e.g. in [Peeren 2003].

An object of the present invention is a method of designing a static-magnetic-field shimming coil system for magnetic resonance imaging, comprising the steps of:
 a) for each member of a cohort of magnetic resonance imaging subjects:
  a1) acquiring a map of a static magnetic field within a region of interest, common to all members, comprising a bodily portion of the member;
  a2) determining a corrective static magnetic field such that a sum of the acquired static magnetic field and the corrective static magnetic field is equal to a target static magnetic field within the region of interest;
  a3) determining a stream function, defined on a reference surface enclosing the region of interest and corresponding to a current density distribution on said surface, minimizing either a cost function representative at least of a difference between the corrective static magnetic field and a static magnetic field generated by said current density distribution, or a cost function representative at least of an electric parameter of the coil system subject to at least one constraint representative of said difference
 b) performing a Principal Component Analysis of the stream functions determined for at least a plurality of members of the cohort; and
 c) determining at least one coil wiring pattern defined on said reference surface by discretizing at least a most significant principal component of said stream functions;
steps a2), a3), b) and c) being carried out using a computer.

Another object of the invention is a static-magnetic-field shimming coil system comprising:
 at least one hollow dielectric support element having a cavity containing said region of interest and a surface having a shape corresponding to said reference surface or, where appropriate, one said additional surface; and
 a set of wire windings deposed on or affixed to said surface of the dielectric support, following looping paths determined through by said method.

Yet another object of the invention is a magnetic resonance imaging apparatus comprising:
 a magnet for generating a static magnetic field having a main component along a direction, called longitudinal direction; and
 a static-magnetic-field shimming coil system as above, adapted for homogenizing at least the main component of said static magnetic field.

Additional features and advantages of the present invention will become apparent from the subsequent description, taken in conjunction with the accompanying drawings, wherein.

Figure 8A:
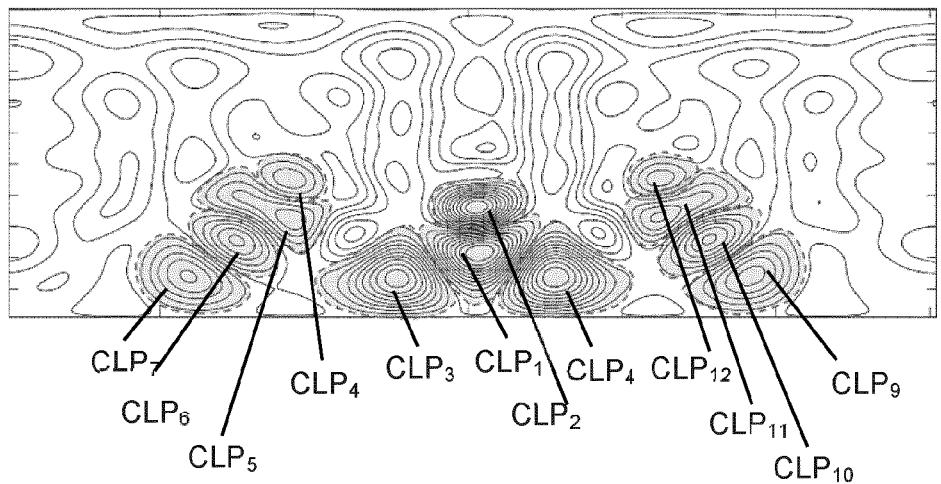
Figure 8B:
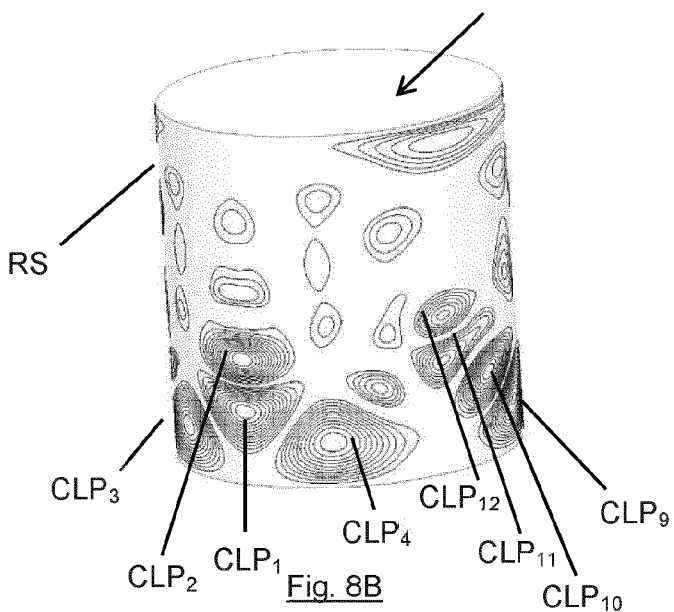
Figures 9A, 9B:
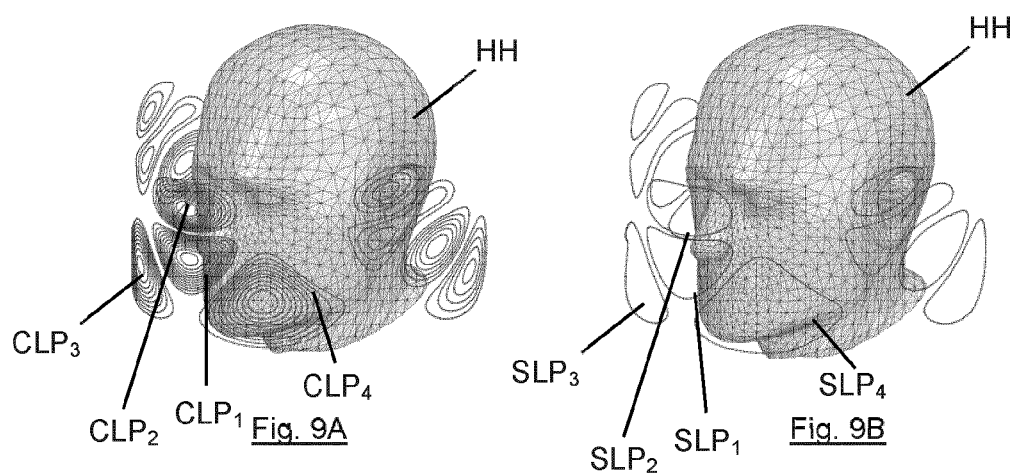
Figure 10A:
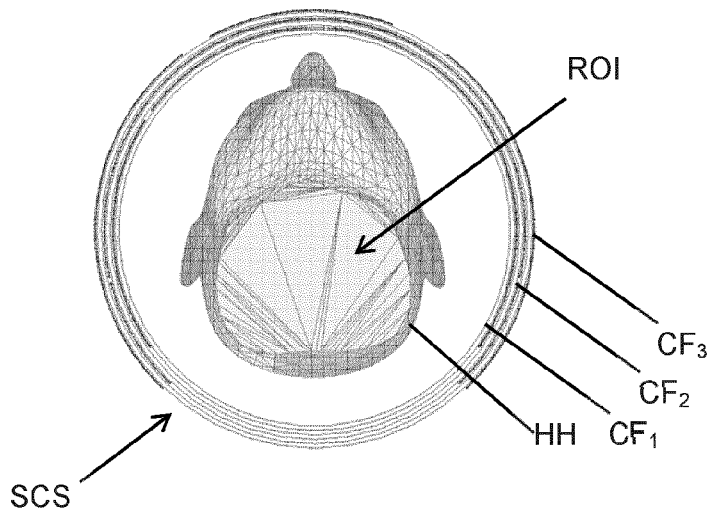
Figure 10B:
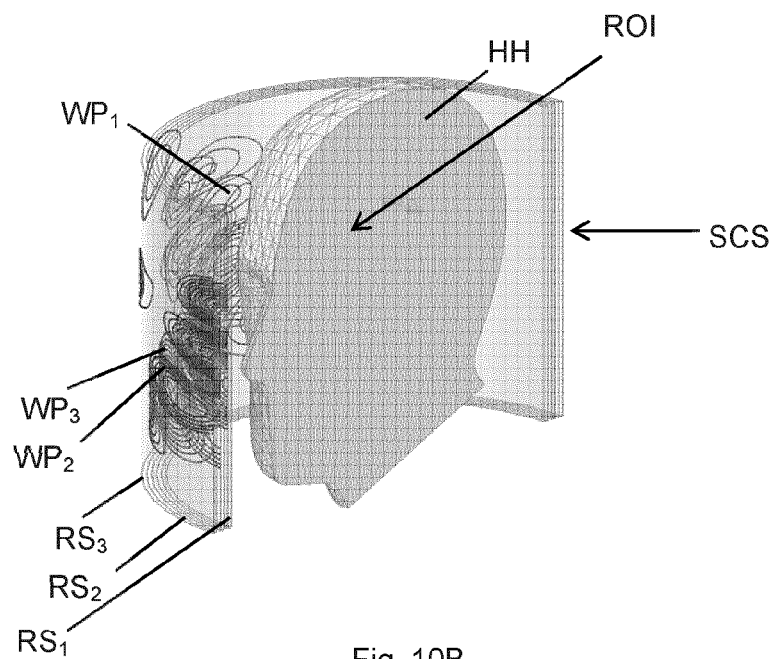
Figure 11A:
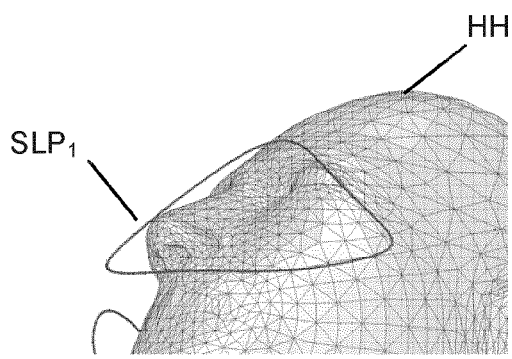
Figure 11B:
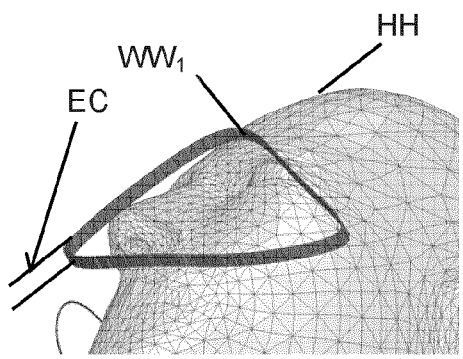
Figure 12:
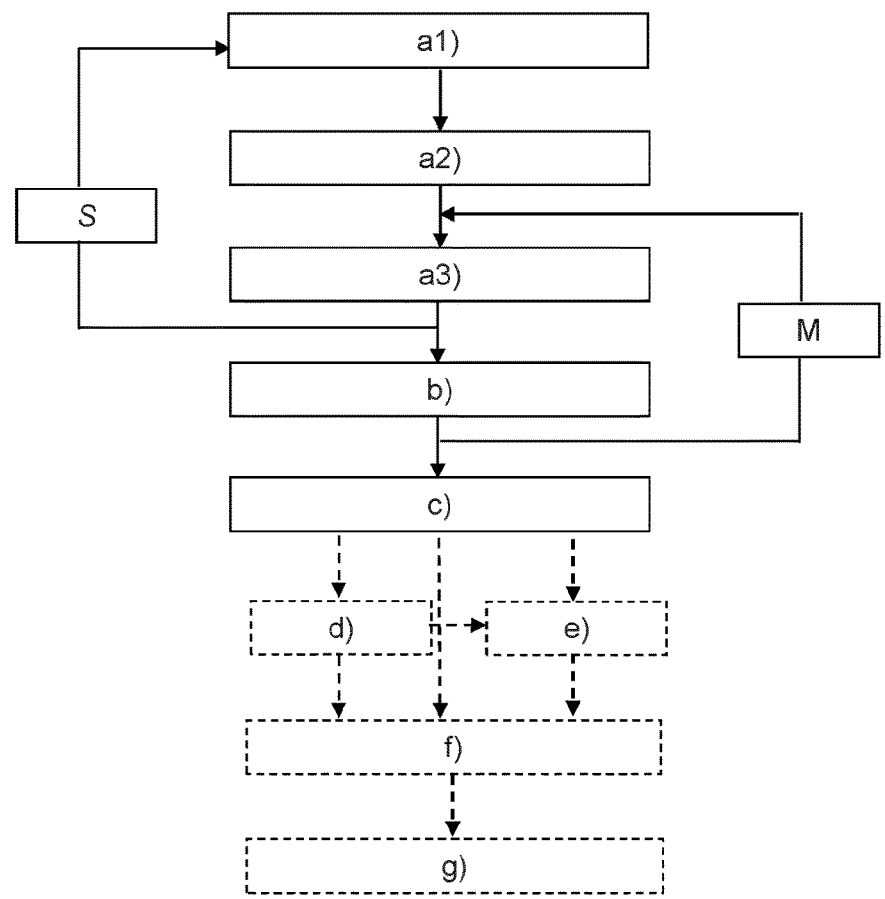
Figure 13:
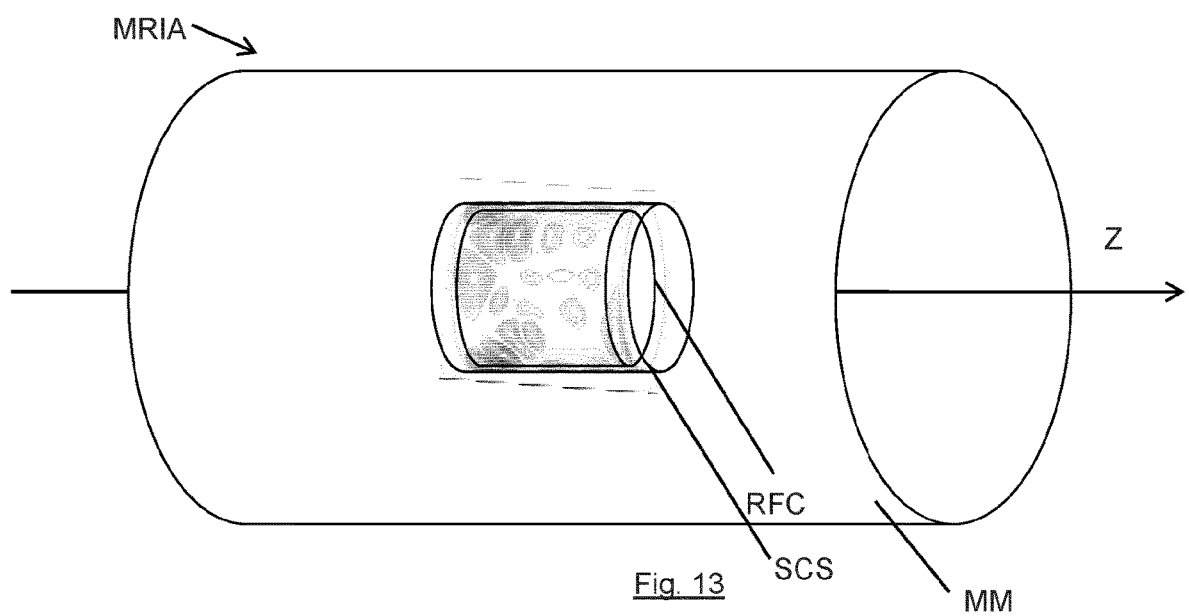
Figure 14A:
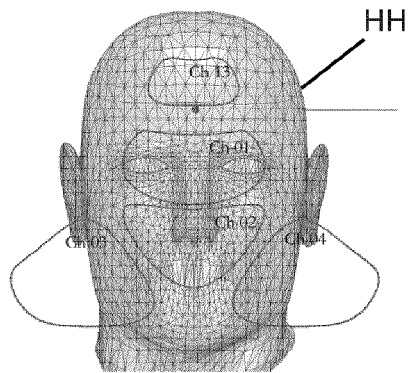
Figure 14B:
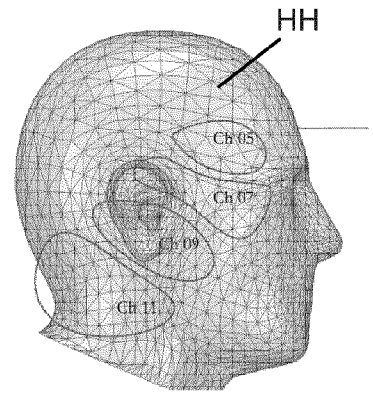
Figure 14C:
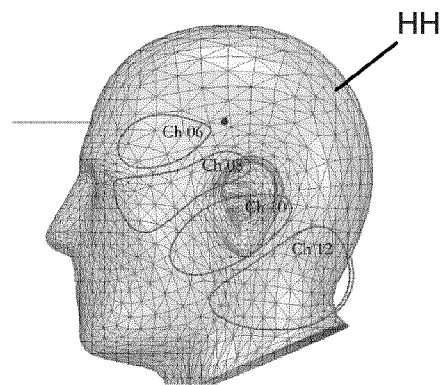
Figure 14D:
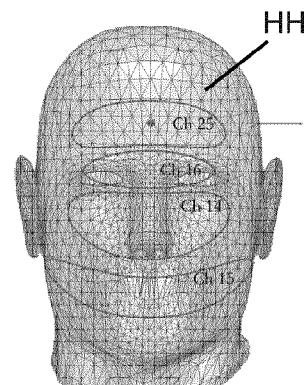
Figure 14E:
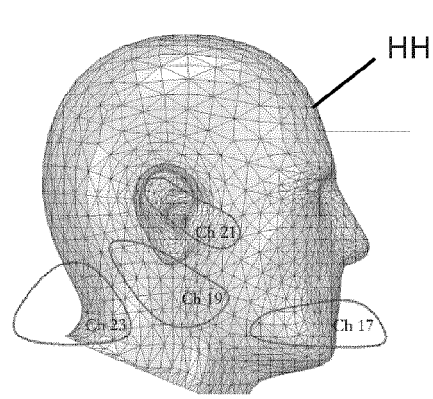
Figure 14F:
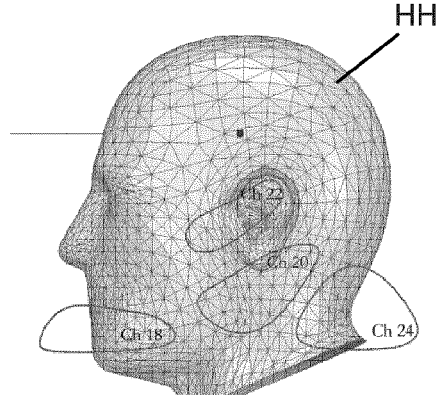
Figure 14G:
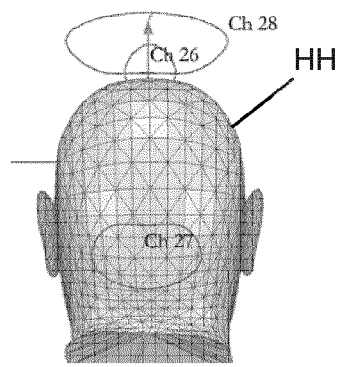
Figure 14H:
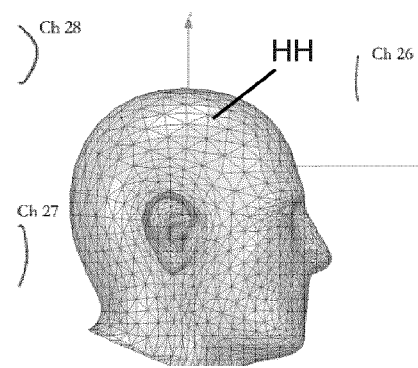
Figure 14I:
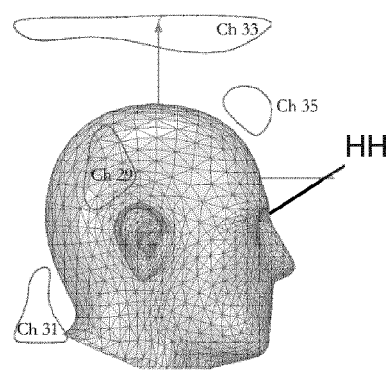
Figure 14J:
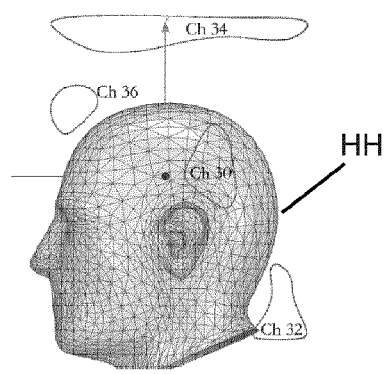
Figure 15:
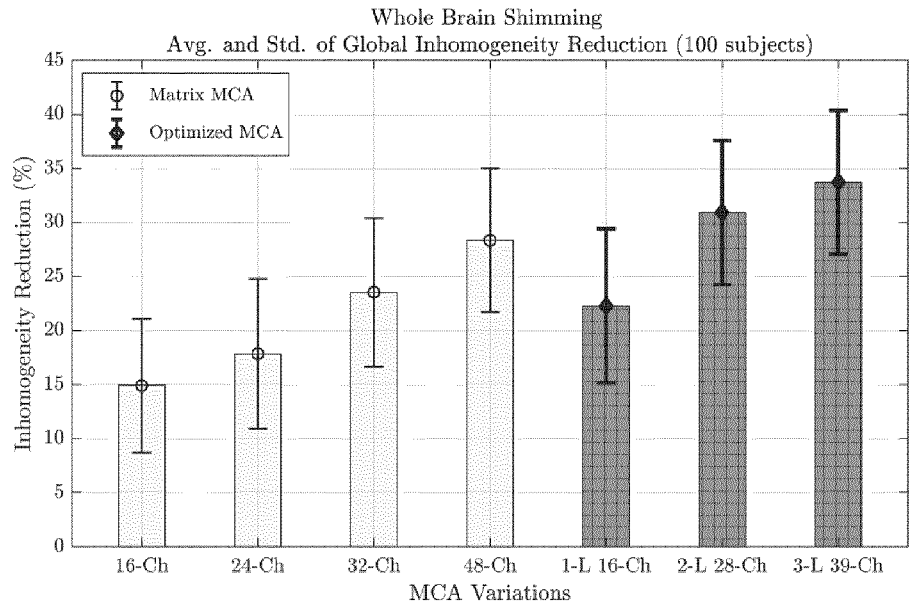
Figure 16:
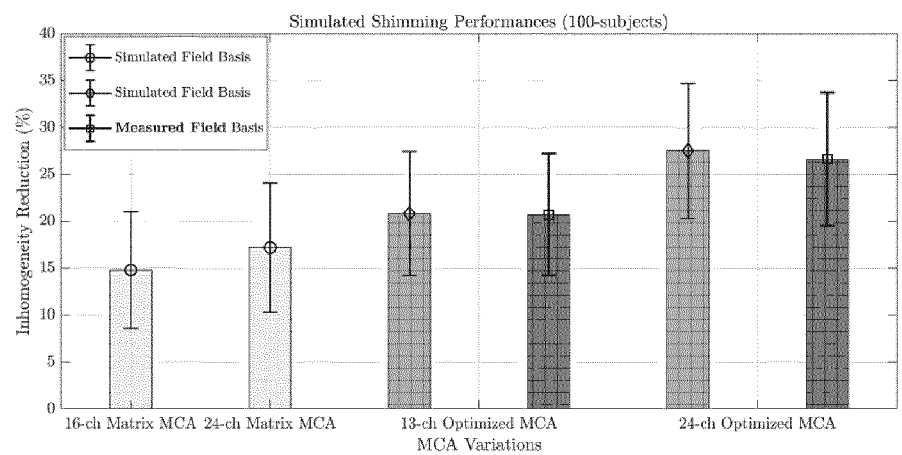

FIG. 8A, an unfolded representation of a coil wiring pattern according to an embodiment of the invention, wherein several loop clusters are identified, and FIG. 8B a three-dimensional view of a coil obtained by symmetrizing the wiring pattern of FIG. 8A;

FIGS. 9A and 9B illustrate the simplification of a coil wiring pattern by replacing a cluster of loop by a single loop;

FIGS. 10A and 10B show a multi-layered coil system according to an embodiment of the invention;

FIG. 11A shows a single-winding model of a loop, used for evaluating the magnetic field, and FIG. 11B a multi-wind model used for physical manufacturing;

FIG. 12 is a flow-chart of a method according to an embodiment of the invention;

FIG. 13 is a very simplified representation of an MRI apparatus comprising a static-magnetic-field shimming coil system according to an embodiment of the invention;

FIGS. 14A to 14J represent a multi-channel multi-layer coil system according to a particular embodiment of the invention;

FIG. 15 illustrates the advantage provided by the invention over the use of a regular MCA known from prior art ([Juchem 2015]) and FIG. 16 demonstrates that experimental results confirm the accuracy of numerical simulations.

Figure 1:
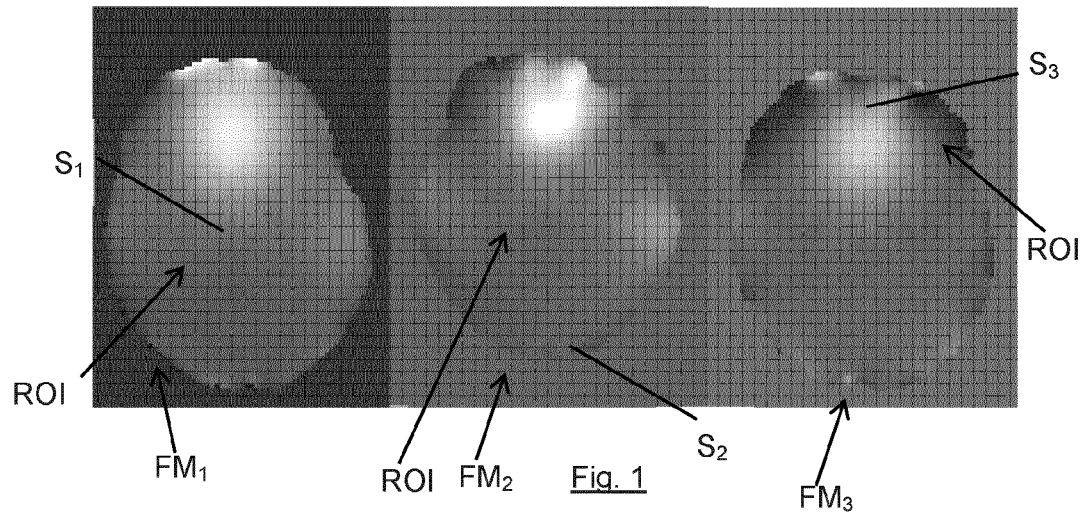
FIG. 1 shows three $B_0$ field maps inside the heads of three patients.

Magnetic field inhomogeneities depend on the specific anatomic features of each patient; therefore they are different from one patient to another, while showing somehow similar patterns. For instance, FIG. 1 shows static magnetic field patterns (fieldmaps) $FM_1$, $FM_2$, $FM_3$ close to the pre-frontal cortex in the heads of three patients, $S_1$, $S_2$ $S_3$.

This similarity of the field patterns makes possible the design of a "universal" coil system, significantly improving the field homogeneity for all or most patients.

In order to design such a coil system, it is necessary to acquire a plurality of static magnetic field maps corresponding to respective MRI patients, forming a cohort. All maps should cover a common region of interest ROI comprising a bodily portion of the members, for instance their heads. The number S of members of the cohort should be sufficient to ensure that it is representative of the patients' diversity—e.g. it should be of at least 50 and preferably 100 or more. In the following, the case of a 75-member cohort will be considered.

The magnetic field maps may be acquired using any known technique, for instance the triple-echo acquisition method disclosed by [Windischberger 2004].

This corresponds to step a1) on the flow-chart of FIG. 12.

From each field map $\Delta B_0^S(\vec{x})$, a corrective static magnetic field $B^C(\vec{x})$ is computed, such that the sum of the measured magnetic field and the corrective magnetic field is equal to a target field $B(\vec{x})$. Usually, the target magnetic field is uniform, or at least has a uniform z-component (the z-axis corresponding to the main orientation of the MRI $B_0$ field). Therefore, for instance, the corrective magnetic field may be oriented towards the z-axis and taking, at each point of the region of interest, the same value as the difference between the target (or average) $B_0$ value and the z-axis component of the measured field.

This corresponds to step a2) on the flow-chart of FIG. 12. The following step—a3) on the flow-chart of FIG. 12—consists in determining a current density distribution on a reference surface (RS on FIG. 2) enclosing the region of interest, such that it generates a magnetic field approaching the corrective field $B^C(\vec{x})$. The reference surface corresponds to that of a supporting structure (coil former) of the coil system to be designed. Rather than directly determining the current density—which is a vector field—however, an auxiliary scalar function I, called "stream function", is determined.

If a surface RS with current density $\vec{j}(\vec{x})$ ($\vec{x} \in S$) is subdivided into a network of infinitesimal square magnetic dipoles each with current $I(\vec{x})$ (cf. FIG. 2, where surface RS is a cylinder), then for a dipole centered at $\vec{x}$, $\vec{j}(\vec{x})$ and $I(\vec{x})$ relate by:

$$\vec{j}(\vec{x}) = \nabla I(\vec{x}) \times \hat{n}(\vec{x}) \qquad (4)$$

where $\hat{n}(\vec{x})$ is a unitary vector normal to the surface. $I(\vec{x})$ is called a stream function for $\vec{j}(\vec{x})$. An elementary magnetic dipole is represented on the right part of FIG. 2.

In the literature, a stream function is most often designated by "Ψ"; hear "I" is used instead to underscore its physical interpretation and the fact that, dimensionally, it is homogeneous to an electric current intensity.

An important property of the stream function is that its contour lines are stream lines of the corresponding current density distribution $\vec{j}(\vec{x})$. The continuous current density distribution $\vec{j}(\vec{x})$ can therefore be approximated by concentrated currents flowing along the contour line of the stream function $I(\vec{x})$ In other words, a coil wiring pattern can be directly obtained by discretizing the stream function.

Figure 2:
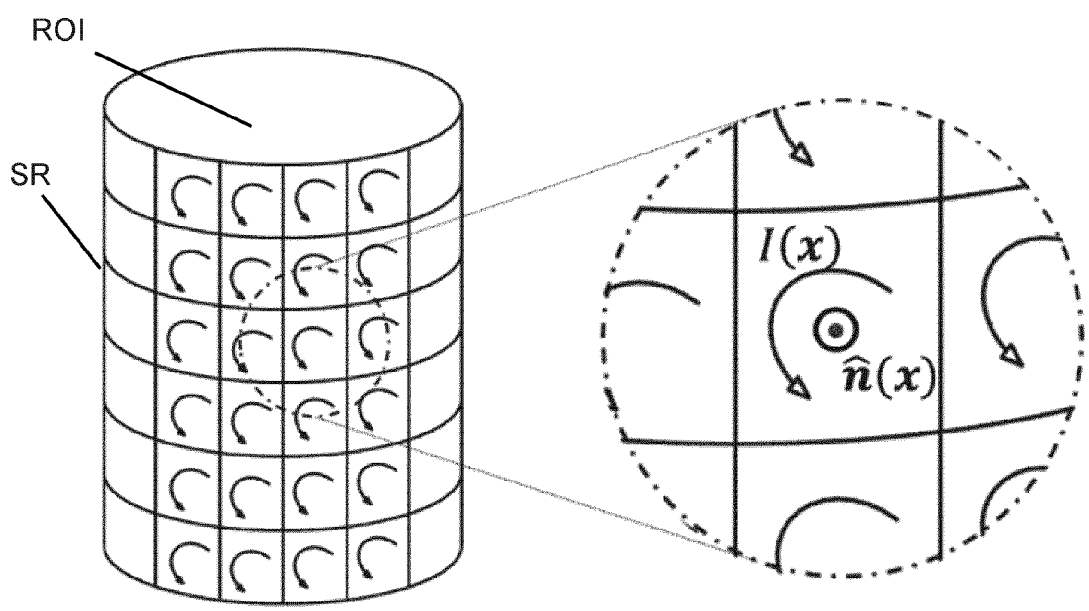
FIG. 2 shows a reference surface discretized into square magnetic dipoles and illustrates the physical meaning of the stream function.
Figure 3:
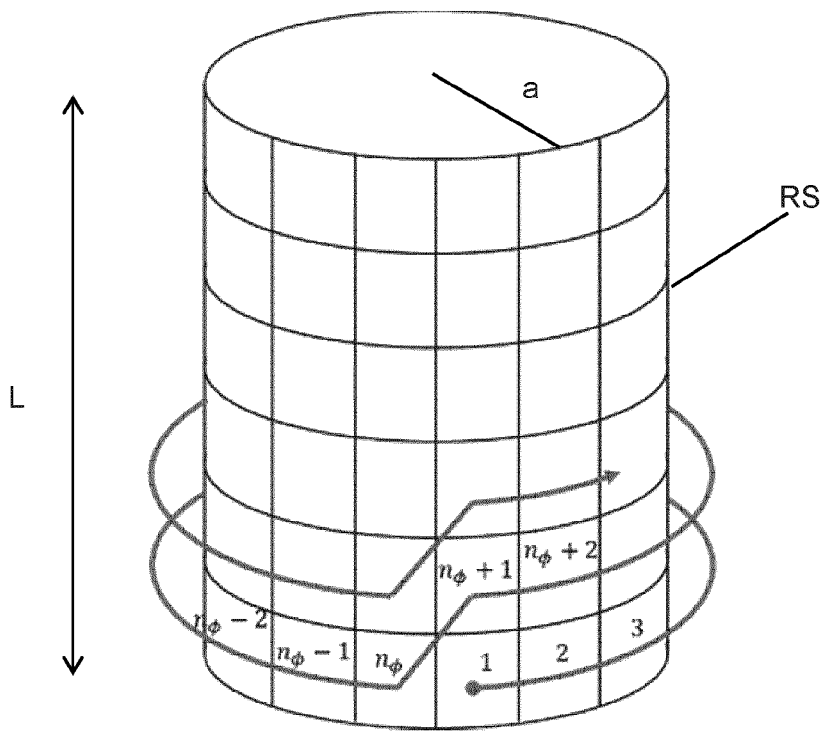
FIGS. 3 and 4 illustrate the numerical computing of a stream function.

Computationally, the reference surface RS—a cylinder of radius a and length L—is discretized into N square dipoles of side h, indexed by index n and carrying electric current (see again FIG. 2, and FIG. 3 which shows the numbering of the N dipoles). The region of interest ROI in which the magnetic field generated by the coil system is supposed to approach a target distribution is enclosed by surface RS. Volume ROI may coincide, for instance, to the brain region of the MRI patients of the cohort. For a discretized target field $b = [b_1 b_2 \ldots b_k]^T$, each dipole current (or stream function) $I = [I_1 I_2 \ldots I_N]^T$ on the reference surface needs to be calculated and post-processed to provide the wiring patterns and electric current intensity that will generate a magnetic field as close as possible to b on a plurality of control points defined inside ROI.

From Biot-Savart law, magnetic field and dipole current relate by:

$$b_k^n \approx \left[ \frac{\mu_0}{4\pi}(a^2 - x_n x_k - y_n y_k)\left(\frac{1}{r_-^3} - \frac{1}{r_+^3}\right) \right] I_n \qquad (5)$$

-continued $$r_{\pm} = \sqrt{(x_k - x_n)^2 + (y_k - y_n)^2 + \left(z_k - \left(z_n \pm \frac{h}{2}\right)\right)^2} \quad (6)$$

Figure 4:
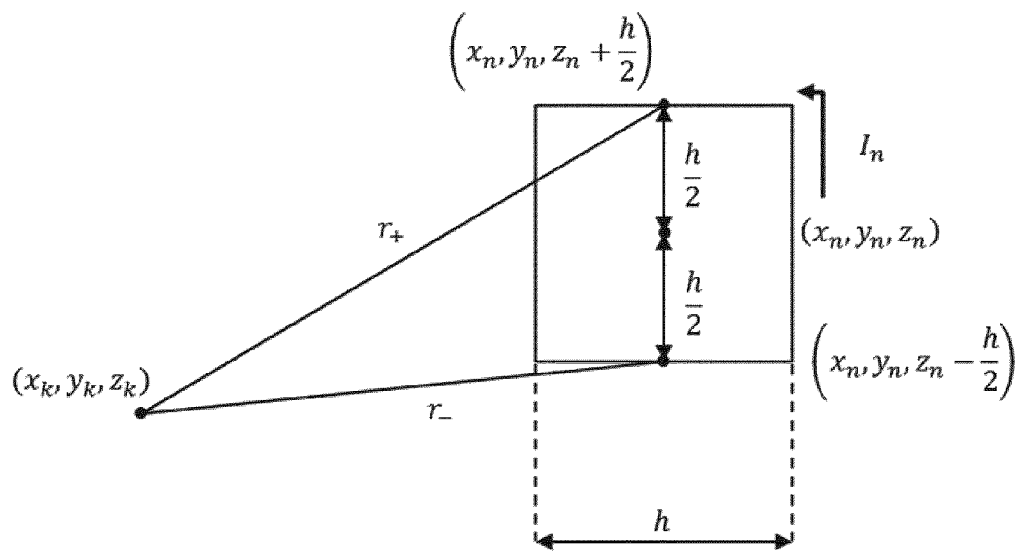

With $(x_k, y_k, z_k)$ a point inside ROI, with $k=1, \ldots, K$, and $(x_n, y_n, z_n)$ the center of the dipole of current $I_n$ (see FIG. 4). This expression for the magnetic field is an approximation. To ensure a small error (e.g. less than 0.5%) in the approximation, h and the maximum distance $\rho=$ $$\max_{k \in [1,\ldots,K]} \sqrt{x_k^2 + y_k^2}$$

of a point in a transversal plane should obey the following empirical relation:

$$\rho \leq ae^{-10\frac{h}{a}} \quad (7)$$

From the previous equations, the relation between magnetic field and dipole current can be put into matrix form as:

$$\tilde{b}_k^n = c_{k,n} I_n$$

Adding the contributions of each square loop of the reference surface, $$\tilde{b}_k = \sum_{n=1}^{N} c_{k,n} I_n \quad (8)$$

$$\tilde{b} = CI \quad (9)$$

With C a K×N matrix. And $$\tilde{b} = [\tilde{b}_1 \tilde{b}_2 \ldots \tilde{b}_K]^T \quad (10)$$

To account for coil power consumption and obtain feasible coil designs, dissipated power $\mathcal{P}$ has to be taken into account:

$$\mathcal{P} = \int_{RS} \frac{|\vec{J}|^2}{\sigma t} ds = \int_{RS} \frac{|\nabla I(\vec{x}) \times \hat{n}(\vec{x})|^2}{\sigma t} ds \quad (11)$$

$$\mathcal{P} \approx \frac{1}{\sigma t} \sum_{n=1}^{N} \left[(I_{n+1} - I_n)^2 + (I_{n+n_\phi} - I_n)^2\right] \quad (12)$$

where $\sigma$ is the conductivity and t the thickness of the cylindrical layer in which currents flow. The above relation can be cast into matrix form:

$$\mathcal{P} \approx \frac{1}{\sigma t} I^T R I \quad (13)$$

with R an N×N matrix.

Assembling power consumption and field error, optimal I as a function of a regularization parameter $\lambda$ is $$I(\lambda) = \arg\min_{I \in \mathbb{R}^N} \|b - CI\|_2^2 + \lambda I^T R I \quad (14)$$

then, $$I = (\lambda R + C^T C)^{-1} C^T b \quad (15)$$

The above stream function I can then be discretized into wiring patterns to form a coil, as explained above and in [Peeren 2003].

The physical parameters a and t can be absorbed into the regularization parameter $\lambda$ and do not need to be set for stream function calculation, but will be taken into account when estimating power consumption of the coil.

The regularization parameter[80] expresses a trade-off between homogenization performances and power consumption. At the end of the design process (or at a sufficiently late stage thereof) it will be expedient to estimate both the magnetic field residual inhomogeneity and the power consumption and, if necessary, repeating the design with a modified value of the regularization parameter[$\lambda$].

This algorithm for coil generation is used to obtain optimal stream functions associated to the field maps of each one the S subjects of the cohort.

Figure 5:
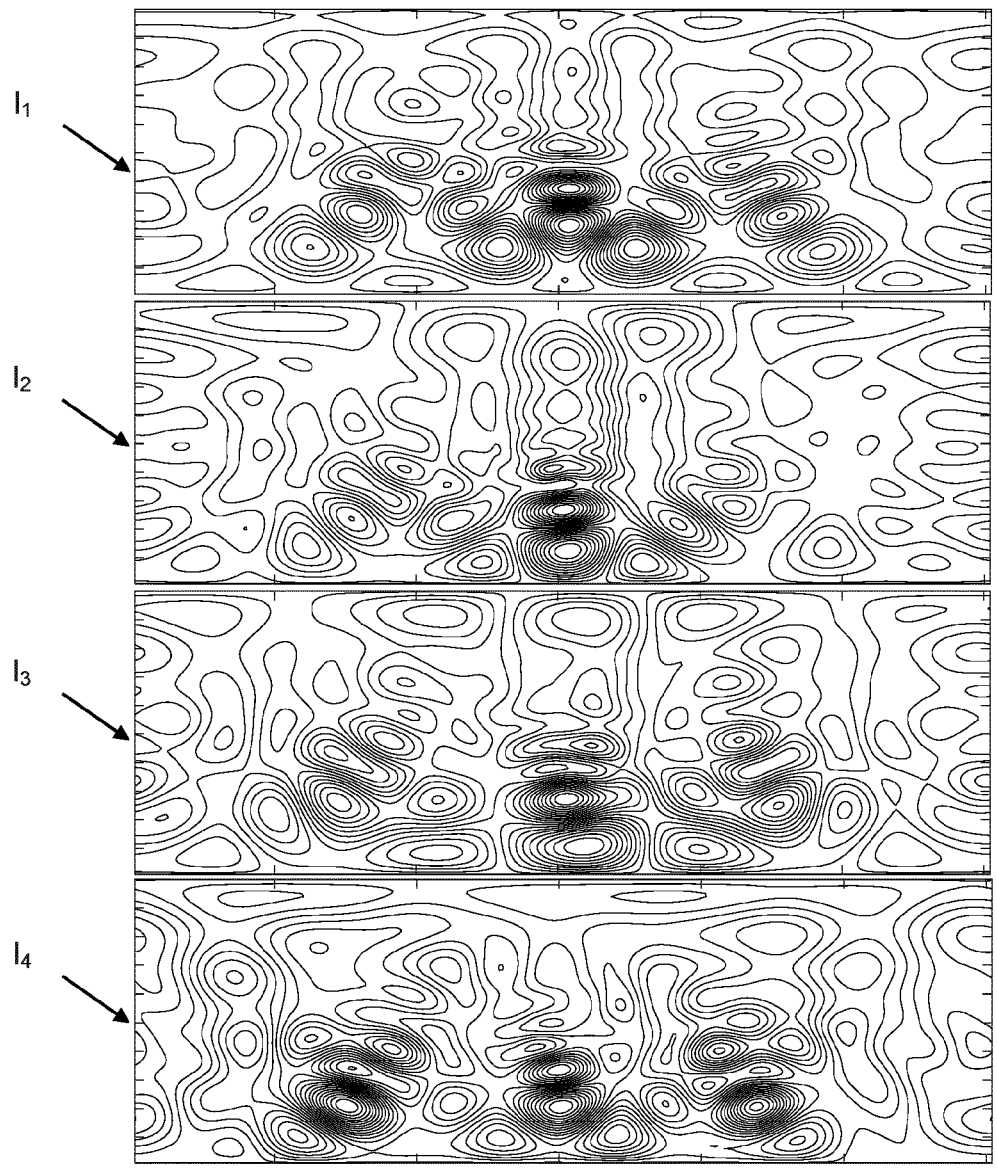
FIG. 5 shows contour plots of optimal stream functions computed for four different subjects.

FIG. 5 shows contour maps of the stream functions $I_1$, $I_2$, $I_3$, $I_4$ obtained for the heads of 4 different subjects. In this figure, the vertical axis corresponds to the z-axis, i.e. the main orientation, while the horizontal axis represents azimuth. It can be seen that they all show somehow similar—albeit non-identical—patterns, with "peaks" and "troughs" of the stream functions at approximately the same locations, corresponding to specific anatomical features: paranasal sinuses, mouth, inner ears . . . . In particular, the looping contour lines in the lower-central part of each panel face the subject's mouth and nose).

In principle, these contour maps could be directly converted into coil wiring patterns optimized for specific patients—this would only require adding electrical interconnections for allowing injecting electrical currents into the wires following the contour lines of the stream functions. However, building a specific coil system for each patient (i.e. subject) is clearly impractical. Therefore, data relative to a plurality of members of the cohort (preferably, all of them) have to be combined to obtain a "universal" coil system, ensuring satisfactory field homogenization for most patients, even not belonging to the cohort. According to the invention, this is obtained by performing a Principal Component Analysis (PCA) of the stream functions for the cohort member (step b of the flow-chart of FIG. 12). Indeed, applying PCA to the stream functions rather than directly to the individual field maps is very convenient: field maps are defined in 3D, and applying PCA to them would require re-alignment of the bodily parts (e.g. brains) to a common center and the creation of a common mask which may be bigger than some brains. Instead, stream functions are defined over a predefined reference function, the same for all subjects.

PCA is preferably carried out through Singular Value Decomposition (SVD).

According to an exemplary implementation of step b), a matrix $I_{DB}=[I_1 \ I_2 \ \ldots \ I_S]$ of dimension N×S is formed. Singular Value Decomposition is applied on $I_{DB}$ and matrices U (N×N), $\Sigma$ (N×S) and V (S×S) are obtained. Those matrices relate by:

$$I_{DB} = U \Sigma V^T \quad (16)$$

From matrices U and Σ, a new set of stream functions is extracted. The new stream functions compose the columns of the matrix $I_{SVD}$ of size N×S, calculated by $$I_{SVD} = U\Sigma \quad (17)$$

And $$I_{DB} = I_{SVD} V^T \quad (18)$$

From previous equations, any dedicated stream coil of $I_{DB}$ can be reconstructed from a linear combination of the new stream functions ("SVD stream functions"), i.e. columns of $I_{SVD}$.

Figure 6:
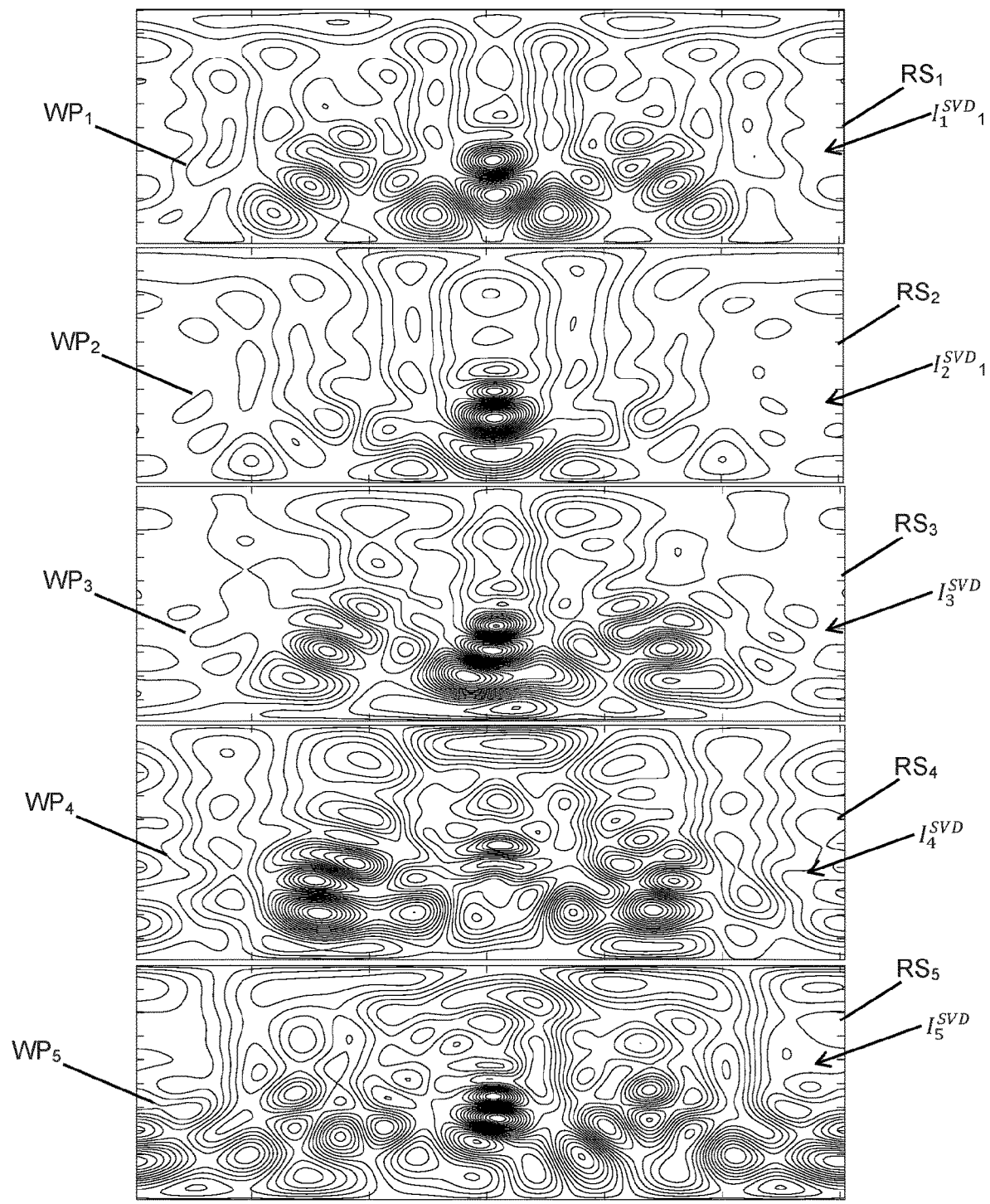
FIG. 6 shows contour plots of the first five principal components of the optimal stream functions computed for 75 different subjects, defining five coil wiring patterns.

For instance, FIG. 6 shows the first five SVD stream functions $I_1^{SVD}, I_2^{SVD}, I_3^{SVD}, I_4^{SVD}, I_5^{SVD}$ obtained from a cohort of 75 subjects.

More interestingly, a small number M of principal components, i.e. of SVD stream functions, or columns of $I_{SVD}$, can be combined with adequate linear coefficients to reproduce the effects of each stream function in $I_{DB}$ within a tolerable error. From a practical point of view, each of the M SVD stream functions will be discretized in order to design a respective coil layer, fed with a respective electric current (step c) of the flow-chart of FIG. 12). The wiring pattern of each coil layer (references $WP_1, WP_2, WP_3, WP_4, WP_5$ on FIG. 6) may be directly obtained by discretizing the stream functions $I_1^{SVD}, I_2^{SVD}, I_3^{SVD}, I_4^{SVD}, I_5^{SVD}$). The combined action of all the coil layers will be to homogenize the static magnetic field within the region of interest.

Intrinsic to the SVD algorithms, the columns of $I_{SVD} = [I_1^{SVD} I_2^{SVD} \ldots I_S^{SVD}]$ are ordered so that the first column is a stream function associated to the highest singular value, the second column to the second highest singular value and so on. Hence, the first column is the stream function with highest correlation to the entire initial set $I_{DB}$ of dedicated stream functions. The second column is the second most correlated and so on. The smaller the singular value, the less a stream function correlates with the entire previous set, which indicates that this stream function addresses a very small number of specific subjects and its use is not justified in view of the complexity to build and power consumption. Thus, only the few first SVD stream functions tend to be of interest.

For brain shimming, let $b_i^{SVD}(\vec{x})$ be the magnetic field per current unit generated by a coil layer obtained from stream function $I_i^{SVD}$. For a fieldmap $\Delta B_0^s(\vec{x})$, the electric currents to drive the M first SVD coil layers should be such that $\sigma(\Delta B_0^s \pm \Sigma_{m=1}^M b_m^{SVD} i_m^s)$ is minimized, where $i_m^s$ is the electric current of the m-th coil for subject s and $\sigma(\cdot)$ represents the standard deviation over all the control voxels of the region of interest. Thus:

$$\vec{i}^s = [i_1^s \ i_2^s \ \ldots \ i_M^s] = \arg\min_{\vec{i}^s \in \mathbb{R}^M} \sigma\left(\Delta B_0^s \mp \sum_{m=1}^M b_m^{SVD} i_m^s\right) \quad (19)$$

preferably under current intensity constraints.

Let $\sigma(\Delta B_{0,shim}^{s,M})$ be the shimmed map inhomogeneity after injection of optimal currents in the M SVD coils for subject s. Shimming performance of the M SVD coil layers can be evaluated by the relative brain field inhomogeneity reduction $\eta_M$:

$$\eta_M = \frac{1}{S} \sum_{s=1}^S \left[1 - \frac{\sigma(\Delta B_{0,shim}^{s,M})}{\sigma(\Delta B_0^s)}\right] \quad (20)$$

or by direct evaluation of average inhomogeneity $\mu_\sigma^M$ $$\mu_\sigma^M = \frac{1}{S} \sum_{s=1}^S \sigma(\Delta B_{0,shim}^{s,M}) \quad (21)$$

Figure 7A:
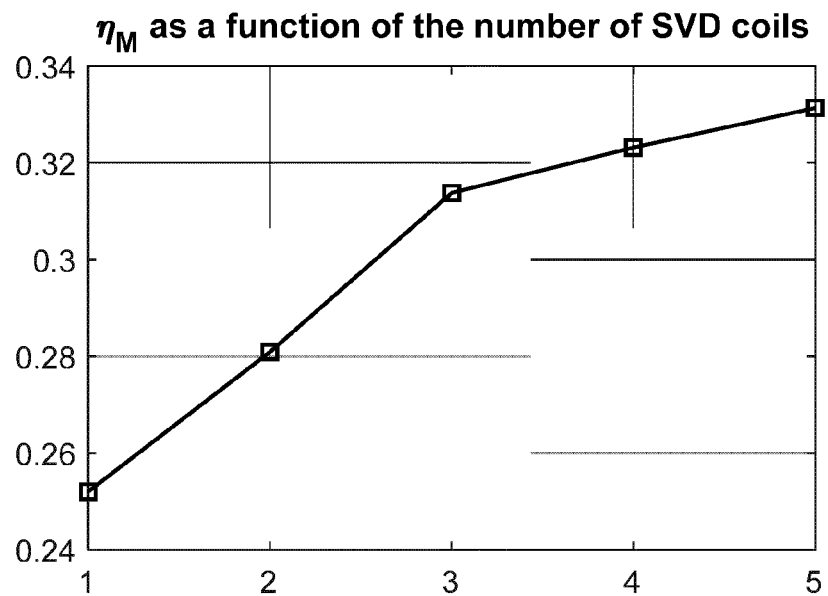
FIGS. 7A and 7B are plots illustrating the performances of a coil system according to an embodiment of the invention for an increasing number of principal components of the optimal stream functions.
Figure 7B:
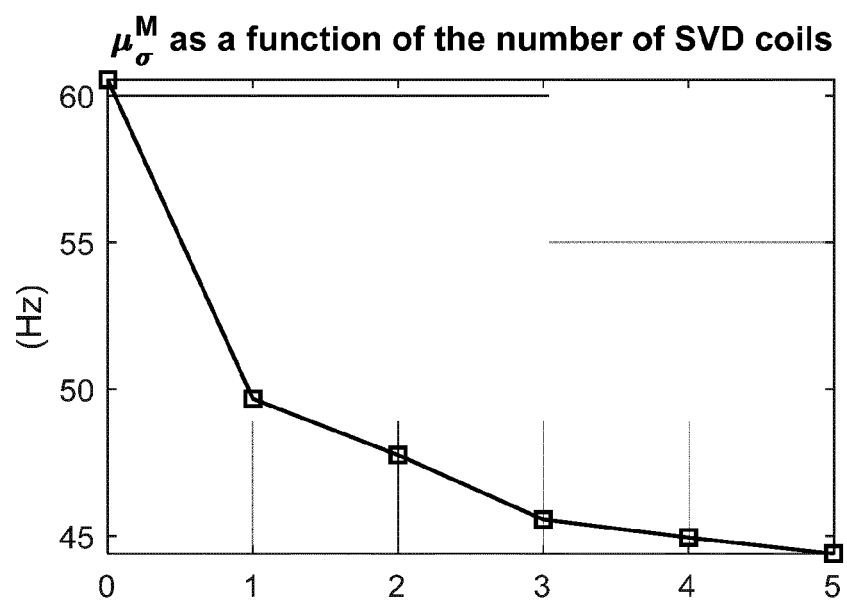

FIGS. 7A and 7B show how the number M of principal components, and therefore of coil layers, affect the field (in)homogeneity, expressed by $\eta_M$ and/or by $\mu_\sigma^M$. This is important for choosing the most expedient number M of coil layers given space and power consumption constraints.

It can be seen that there is a significant amelioration in global homogeneity with the application of the first SVD coil layer. After the first coil, 2nd and 3rd SVDs also improve system performance, although absolute gain is small if compared to the first component. As the amount of coils increases, there is a clear and abrupt change in the rate of improvement after the 3rd coil, which exemplifies that 3 coils could be a suitable choice given space or cost constraints, since rate of improvement is smaller from this point onward. For very demanding applications, 5, 7 or even 10 coil layers may be used, but very seldom more.

The inventors have found that to achieve the same performances of a complete 5th order Spherical Harmonics shim insert, composed of at least 20 coils, only three SVD coil layers are required.

A difficulty is that all the SVD stream functions are defined on a same reference function, while in practice the different coil layers must be mounted on different, non-intersecting formers enclosing the region of interest. One possibility of overcoming this difficulty is to repeat the calculations above (steps a3) and b)) for different, disjoint reference surfaces ($RS_1, RS_2, RS_3, RS_4, RS_5$ on FIG. 6) then choosing the first principal component defined on the first reference surface, the second principal component defined on the second reference surface and so on.

For instance, calculation may be performed first considering a cylindrical reference surface of radius $a_1$ and length L, modelling the former for the first SVD coil layer, then the calculation may be performed again using additional cylindrical reference surfaces of increasing radii.

For the second coil, a new former of radius $a_2$ and length L is defined and the stream function generation procedure is performed for the whole cohort of subjects. A new set of SVD stream functions, this time over $a_2$, is obtained and the second column of the new SVD matrix $I_{SVD}$, is discretized into a coil layer. This procedure is repeated for the following SVD stream functions at new formers of dimensions $a_i$ and L until the chosen number of coil layers is reached.

According to an alternative approach:

A three-dimensional closed surface (preferably a sphere) sufficiently large to enclose the regions of interest of all the subjects is determined.

M>1 SVD stream functions are computed as explained above, all defined on a cylindrical reference surface of radius $a_1$, corresponding to the first coil layer. This directly allows designing the first coil layer.

For each higher-order stream function (of order i>1):
The magnetic field (or at least the relevant component thereof) generated on the three-dimensional closed surface is computed.
A stream function defined on a cylindrical reference surface of radius $a_i$, such that the corresponding current density generates the same magnetic field (or magnetic field component) on the same surface is computed, e.g. by applying equation (15). Indeed, since the magnetic field generated by any external coil obeys Laplace's equation inside the volume of the closed surface, the magnetic field over the surface is sufficient as target field for the computation of the new stream function.
The $i^{th}$ coil layer is then designed based on the said stream function.
Further alternative approaches are possible. For instance, higher-order SVD stream functions may be projected onto surfaces of increasing radii.

FIGS. 10A and 10B represent, respectively, a transverse view and a cutaway lateral view of a three-layer shimming coil system SCS according to an embodiment of the invention, surrounding a human head HH. The shimming coil system comprises three dielectric coil formers $CF_1$, $CF_2$, $CF_3$ having the shape of nested, hollow cylinders whose internal (or, alternatively, external) surface carries conducting elements, such as wires or printed metallic tracks, forming wiring patterns $WP_1$, $WP_2$, $WP_3$. The region of interest ROI is situated inside the innermost coil former.

Several post-treatments may be applied to the SVD stream functions before completing the design of the coil layers. First of all, it is important to choose a suitable discretizing step for converting the stream functions to wiring patterns: too fine a discretization of the stream functions would lead to very complicated pattern, while a too coarse one would reduce performances. Moreover, at least for some applications, it may be useful to symmetrize the SVD stream functions, e.g. by averaging each function with its mirror image in the left-right direction. Indeed, heads are supposed to be almost perfectly symmetric, therefore no systematic asymmetry of the stream functions is expected. However, some asymmetry may be present for an individual (for instance, his/her left sinus may be filled with mucus while his/her right sinus is filled with air, or vice-versa). It is expected that some outermost SVD components catch this kind of variability. Therefore one could choose to symmetrize the first SVD layers, but not the other ones.

Also symmetrizing may not be expedient for e.g. torso, because the torso anatomy is not symmetric.

Until now, it has been assumed that a same current intensity flows into all the wires forming a coil layer. However, this assumption can be relaxed: it is possible, and often advantageous, to decompose each coil layer into a plurality of independently driven channels (step d) in the flow-chart of FIG. 12). The SVD stream function approach at the core of the invention is therefore combined with a Multi-Coil array (MCA) one. The advantage of this approach is that current intensity values in the different channels may be optimized for each individual MRI subject. Therefore, while the coil system geometry is "universal", i.e. the same for all patients, adjusting the driving currents allows some "personalization" of the shimming. Moreover, the MCA configuration allows finer shim tuning when the ROI is reduced to, for instance, a brain slice in 2D imaging. This feature can be further exploited with dynamic B0 shimming, whereby shim currents are updated in real-time to address a slice by slice acquisition such as in Echo Planar Imaging [Juchem 2015, Stockmann 2018].

According to an embodiment of the invention, each channel corresponds to a cluster of approximately concentric loops in an SVD stream function contour plot. The clusters may be identified visually, but an automated approach is also possible. This approach consists in identifying contours that contain one and only one extremum of the stream function. The number of loops/contours around an extremum is relevant, since the greater the amount of loops, the greater the electric current that needs to pass around the associated extremum, making that particular cluster more relevant. Therefore, clusters only containing a small number of loops (below a certain empirically-determined threshold) may be ignored.

Otherwise stated, two steps are required to isolate and select channels for each SVD layer considered:
1. Every candidate channel is formed by an agglomeration of contours around a same extremum and containing only this extremum in their interior.
2. A cluster of contours will only be considered a channel if composed by a minimum amount of contours; this minimum threshold will be determined based on:
the total number of channels wanted in the MCA,
which SVD layer is being considered (the 1st SVD layers having a priori more impact than the next ones, their minimum threshold may be lower),
the number of candidate clusters per SVD layer (for instance, less candidate clusters in the first SVD layers may translate into an even lower threshold in these layers, or to a higher threshold in the outer layers), After obtaining the clusters, the designer can simulate and evaluate their effects on the overall performance, quantitatively assessing the relevance of a particular channel for the system. If the observed gain in performance for adding a specific channel is marginal, that particular channel could be discarded for cost effectiveness, or potentially replaced by another candidate cluster that was initially discriminated against by the threshold set on the minimum amount of contours A simpler alternative to the method described above is to fix the number of channels wanted in each SVD layer arbitrarily, in which case the above criterion about a minimum number of contours per channel may be discarded.

FIG. 8A is an unfolded representation of a coil wiring pattern according to an embodiment of the invention, wherein several loop clusters ($CLP_1$-$CLP_{12}$) are identified. FIG. 8B a three-dimensional view of a coil—more precisely, of a multi-channel coil layer—obtained by symmetrizing the wiring pattern of FIG. 8A.

Another possible post-treatment consists in replacing all the loops of a cluster by a single loop, usually the outermost one, resulting in what can be called a "concentrated" coil design (if all the loops are kept, one may speak of "distributed" design). It should be understood that, within this context, a "loop" does not necessarily represent a single turn of wire. More precisely, one should speak of "looping path" and several wire loops may be tightly concentrated around such a path forming a loop-shaped winding.

FIG. 9A shows a "distributed" coil layer surrounding a human head HH, and FIG. 9B the corresponding "concentrated" layer. On FIG. 9B, single looping paths $SLP_1$, $SLP_2$, $SLP_3$, $SLP_4$ . . . replace loop clusters $CLP_1$, $CLP_2$, $CLP_3$, $CLP_4$ . . . .

The concentrated design will be preferred over the distributed design due to easiness to build and their lower current requirements, although distributed design benefits from lower inductance and resistance per channel (lower inductance is beneficial when currents are switched on or off, as in dynamic shimming) and, in principle, allows a better approximation of the magnetic field of its generating SVD coil. Indeed, for a same number of turns, distributed design will demand more electric current for generating a same field intensity if compared to concentrated design. Thus, power consumption will tend to increase and the advantage of having lower resistance will be lost. Therefore, for a fixed current rating of a current drive, the number of turns of the distributed design will be greater, inductance will be grater and even more physical space will be necessary. As a consequent, the benefits provided by the distributed design (mainly, a slightly better approximation of the target magnetic field) will not be meaningful enough to compensate the costs.

Simplifying the wiring pattern by replacing the native distributed design by a concentrated design corresponds to step e) in the flow-chart of FIG. 12. It can be understood from this flow-chart that step e) can be carried out independently from step d), i.e. even in a single-channel system.

Within the MCA approach, with geometry and position of the single loop obtained for C channels distributed over multiple layers, their magnetic field per current unit can be calculated by Biot-Savart law or with a dedicated electromagnetics simulation software. It is also important to calculate the inductance and resistance of each channel, which can also be accomplished using an electromagnetics simulation software.

Let $b_c^{MC}(\vec{x})$ be the magnetic field per electric current unit per turn for the c-th channel. The electric current to drive each channel for each patient is obtained from minimization of inhomogeneity.

$$\vec{i}^{s,MC} = [i_1^{s,MC} \; i_2^{s,MC} \; \ldots \; i_C^{s,MC}] = \arg\min_{\vec{i}^{s,MC} \in \mathbb{R}^C} \sigma\left(\Delta B_0^s \mp \sum_{c=1}^{C} b_c^{MC} i_c^{s,MC}\right) \quad (22)$$

preferably under current intensity constraints.

Then, average and maximum values for electric current can be obtained for each channel:

$$\mu_i^c = \frac{1}{S}\sum_{s=1}^{S} |i_c^{s,MC}| \quad (23)$$

$$i_c^{max} = \max_{s \in \{1,\ldots,S\}} |i_c^{s,MC}| \quad (24)$$

Optimization of current intensities is carried out in a similar way in the case of MCA distributed design.

Before being able to proceed to manufacturing, additional post-treatment operations are required, namely:
 dimensioning the coils, i.e. determining the number of turns of electric wire following each looping path, forming a winding, and the gauge of the wire;
 designing electrical connections between windings and current generators, and between different windings of a same cluster, which will be connected in series in order to carry a same current intensity.

These operations are schematically represented on FIG. 12 as step f), while step g) corresponds to the physical manufacturing of the coil system.

At least steps a2) to c), and preferably also steps d) to f), are carried out in whole or in part using a suitably programmed computer.

In most cases, multiple wire turns following each looping path will be used to physically implement the designed coil wiring, in order to reduce the required current intensity (from the point of view of magnetic field generation, what matters is the product of the current intensity by the number of wire turns). The wires may be superposed in the radial direction of the supporting surface, or juxtaposed in an axial direction. As a consequence, the geometry of the actual coil will be slightly different from the computed one, as illustrated by FIG. 11a (showing a single looping path $SLP_1$ of a concentrated-design coil layer) and FIG. 11b (showing a winding $WW_1$ constituted by multiple wire turns following said looping path and superposed in the radial direction, i.e. forming multiple layers; reference EC represents electrical connections allowing injecting an electric current into the winding $WW_1$).

Using a small number of turns has the advantage of minimizing the inductance, but requires higher current intensities, and therefore more complex power supplies, and large wires, whose centerlines are necessarily spaced from each other, causing deviations of the magnetic field from its expected distribution. Using more turns of a smaller wire increases the inductance and, if the turns are superposed in multiple layers, may cause occupancy problems inside an MRI apparatus.

Another option would be to build each coil by cutting through bulk copper. In comparison to multiple layers of wire, bulk copper will allow for a smaller coil thickness for equivalent conducting cross-section. A bulk-copper single loop will also have lower resistance and inductance, easing eddy current compensation during MRI gradient coil switching, as well as dynamic shimming ability for multi-slice acquisitions. Electric current, however, will be higher, making the power supply more complex, even though power consumption will remain the same.

Coil thickness will need to be taken into account for calculating the maximum amount of coils that can be used if physical space is limited. In addition, it is also necessary for defining the radius of each coil in the set.

Electrical connections should be designed in order to minimize the magnetic field disturbance they introduce. For instance, in the usual case of coils supported by a cylindrical surface having its axis oriented along a direction z and where the aim is to homogenize the z-component of the magnetic field, the connection wires will be predominantly oriented along z.

Physical manufacturing of the coil system may be carried out using conventional techniques. For instance, the coil former may be hollow dielectric support element (e.g. open cylinders) having a surface having a shape corresponding to the reference surface. Said surface may be structured—e.g. by machining—to allow the winding of the coils. Alternatively, the wires may be deposed e.g. by electrochemical methods, on the surface. Additive manufacturing may also be used.

FIG. 13 is a very simplified representation of a MRI apparatus (or scanner) MRIA showing a shimming coil system SCS according to the invention surrounding a MRI radio-frequency (RF) coil RFC and situated inside a main MRI magnet MM whose static magnetic field, mainly oriented along axis z, is to be homogenized. Gradient coils are not shown for the sake of simplicity. The coil former of the inventive coil system is situated at the isocenter of the main MRI magnet.

An exemplary embodiment of the invention will now be discussed in detail with reference to FIGS. 14A to 14J.

The fieldmap database used to design the shimming apparatus had the following properties:
- cohort of 75 subjects
- 3D Acquisition with 1.70 mm isotropic resolution
- Acquired with 3T scanner with built-in $2^{nd}$ order SH shimming.
- Field intensity linearly rescaled to 7T (to design an UHF Shimming Apparatus)

At 7T, the average inhomogeneity of the acquired database used for coil generation was 67 Hz.

The coil system was intended to be positioned at the exterior of a cylindrical RF coil of radius 135 mm. In addition, the RF coil was centered at the isocenter of the gradient coils and free-space between RF coil exterior and tabletop was 20 mm. A 4 mm gap between RF coil exterior and the first shim coil supporting structure was left for possible forced airflow cooling or shim insert reinforcement. Thus, the radius $a_1$ of the first cylindrical coil layer had to be greater than 139 mm. Remaining space for the coil system was 16 mm.

To accurately estimate coil thickness, a first SVD coil generation was performed assuming an arbitrary radius $a_1 > 139$ mm. Chosen parameters to initiate coil design were: $a_1 = 143$ mm, $L = 300$ mm and $\lambda = 25.10^{-16}$.

The coil generation algorithm and subsequent application of singular value decomposition provided a SVD Stream Function set $I_{SVD}{}^a{}_1$. From the set of stream functions, an initial discretization into windings was performed on the five first SVD stream functions. The following steps were considered in the discretization:

1. Minimal wire spacing (i.e. distance between neighboring wire centers) $d_{min} = \min d_i$ was set at 1.2 mm. $d_{min}$ was also taken as the maximum allowable wire diameter (gauge); in practice, the wire gauge was set to be 1 mm to account for wire insulation.

2. Electric current was computed as $I_a = \max(\nabla I(\vec{x})) d_{min}$.

3. It was checked that 1 mm wires could support current $I_a$. If that had not been the case, it would have been possible either to increase the wire gauge, and therefore $d_{min}$, or to increase the amount of wire layers, piling wires on top of each other, thus reducing the input current by $n_L$, with $n_L$ being the amount of layers.

The following issues have to be considered:
Increasing the wire gauge allows more current to flow but the input current also increases, thus the power supply might become more complex. In addition, having larger and more spaced wire centers means a poorer discretization that might cause field deviations.

Increasing the amount of layers from 1 to $n_L$ reduces power by a factor of $1/n_L$, but inductance increases by a factor of $n_L^2$, thus it should be treated carefully. In addition, more layers imply more thickness for the coil, which can be a limiting factor depending on available space for the system.

Wiring patterns were then obtained for the first five SVD coils. Their performance over the set of 75 subjects was evaluated, together with current ratings and power consumption.

Average inhomogeneity reduction over the database was 29% with 5 SVD coils, maximum coil current with $n_L = 1$ was 50 A and maximum power is 306 W. Both values were unacceptably high, unless a specific cooling system was used. In addition, 50 A current rating would have required complex and expensive power supplies. Thus, it was decided to reduce current ratings and power consumption. To do so, the number of layers of wire ($n_L$) was increased. Taking $n_L = 5$, electric current dropped to 10 A and power consumption to 61 W. With these layers, the thickness of the wire pile was around 6 mm. Thus, the maximum number of SVD coil layers that fitted in the available space of 16 mm was two, since thickness of coil supporting structure needed to be considered.

Current and power ratings could have been further decreased by performing a statistical analysis of the electric current values. A cumulative probability function was plotted for the electric current in each channel. It was found that limiting maximum coil current to 36 A still satisfies the demand of 95% of the subjects. Thus, with $n_L = 5$, electric current drops to 7 A. Using $n_L = 4$ electric current rating can be set at 9 A and coil thickness will be slightly reduced, which is desirable. Maximum power drops to 40 W. At this point, the regularization factor could be increased to reduce power consumption at the expense of loss of performance in inhomogeneity reduction. In this design the original $\lambda$ value was kept.

$\delta = a_2 - a_1$ was set at 8 mm to encapsulate mechanically-supporting resin between conducting SVD layers. Then, the radius $a_2$ of the second SVD coil was set at 151 mm.

At this point of the design process, system parameters were:

$$a_1 = 143 \text{ mm}, a_2 = 151 \text{ mm}, L = 300 \text{ mm and } \lambda = 25.10^{-16}.$$

Stream function generation and SVD decomposition was performed again using the new radius $a_2$. From the resulting $I_{SVD}{}^a{}_2$, the second SVD stream function was discretized with same $d_{min}$ and $n_L$. Considering a system composed of only the two first SVD coils, maximum current was 8.5 A and maximum power was 44 W. Maximum average current value of the two channels was 3.6 A and average power consumption was 10 W.

Simulation showed that the two-layer coil system provided inhomogeneity reduction of 22% over the cohort. The same performance using common SH shim coils would have only been achieved with full 5th order SH shimming, which means a 27-coil insert.

To further improve the performance of the coil system, it was decoupled into multiple independent channels (MCA approach), which provides extra degrees of freedom and eliminate complex wiring patterns of little utility. Moreover, left-right symmetry is forced over the SVD stream functions, as shown in the equation below:

$$I_{sym}(\phi, z) = \frac{1}{2}(I(\phi, z) + I(-\phi, z)) \quad (25)$$

where $\phi \in [-\pi, \pi]$ and $z \in \left[-\frac{L}{2}, \frac{L}{2}\right]$.

Clusters of looping patterns corresponding to different channels were identified as described above, i.e. by finding sets of contours that contain one and only one extremum of the symmetrized stream function; alternatively, visual inspection could have been used. For the present invention, 36 channels were picked from first and second SVD layers (24 from the first layer and 12 from the second one) to form an Optimal Multi-Coil Array. Moreover, a concentrated design was chosen: all the contour lines of the stream functions of a same cluster (channel) were replaced by a single looping path, in this case corresponding to the outermost contour line of the cluster. FIGS. 14A-14J show the single loop models (i.e. the looping path of the concentrated design) for each one of the 36 channels, identified by references Ch1-Ch36, and their positioning relative to a modeled human head. It should be recalled that each loop may actually be constituted by several wires on top of each other, cf. FIG. 11B), and that feeding connections (oriented in the vertical, i.e. axial, direction) must be added to inject the electric currents.

The construction of a "concentrated" multi-coil array is simpler than making the concentric distribution of loops directly obtained by discretizing the SVD stream functions. It comes with the advantage of consuming less current per loop, since higher field penetration is present. However, for a same amount of turns composing a channel, resistance and inductance will be higher compared to distributed concentric loops.

Electromagnetic simulations of the SLM were performed to obtain the magnetic field generated in space by each channel per ampere. The simulations also provided single loop resistance and inductance for each channel.

Once the magnetic fields per ampere were obtained, they were used over the fieldmap database to evaluate the performance of the system and the electric current ratings. When unconstrained, current ratings tended to present high values, indicating that many turns of wire will be necessary for the channels. At this point, system performance evaluation could be performed with constrained current ratings.

The designer should evaluate the performance with constrained currents together with channel inductance, number of wire turns and maximum current to obtain a suitable compromise according to the application requirements.

The new amount of turns should then be wound following the trajectory of the single looping path. Thus, each channel will be formed by a concentration of tightly wired turns around the single looping path, forming a geometric center.

The following table 1 shows the chosen amount of turns for each channel and their electrical properties:

TABLE 1

| Channel | Layer | Turns | Inductance (µH) | Resistance (mΩ) |
|---|---|---|---|---|
| Channel 01 | 1 | 20 | 88 | 112 |
| Channel 02 | 1 | 20 | 87 | 114 |
| Channel 03 | 1 | 20 | 112 | 138 |
| Channel 04 | 1 | 20 | 112 | 138 |
| Channel 05 | 1 | 15 | 30 | 54 |
| Channel 06 | 1 | 15 | 30 | 54 |
| Channel 07 | 1 | 15 | 43 | 80 |
| Channel 08 | 1 | 15 | 43 | 80 |
| Channel 09 | 1 | 20 | 74 | 96 |
| Channel 10 | 1 | 20 | 74 | 96 |
| Channel 11 | 1 | 20 | 96 | 120 |
| Channel 12 | 1 | 20 | 96 | 120 |
| Channel 13 | 1 | 20 | 51 | 70 |
| Channel 14 | 2 | 20 | 92 | 118 |
| Channel 15 | 2 | 20 | 102 | 144 |
| Channel 16 | 2 | 20 | 64 | 86 |
| Channel 17 | 2 | 20 | 84 | 116 |
| Channel 18 | 2 | 20 | 84 | 116 |
| Channel 19 | 2 | 20 | 72 | 96 |
| Channel 20 | 2 | 20 | 72 | 96 |
| Channel 21 | 2 | 20 | 53 | 76 |
| Channel 22 | 2 | 20 | 53 | 76 |
| Channel 23 | 2 | 20 | 86 | 110 |
| Channel 24 | 2 | 20 | 86 | 110 |
| Channel 25 | 2 | 20 | 78 | 106 |
| Channel 26 | 1 | 20 | 39 | 54 |
| Channel 27 | 1 | 10 | 21 | 51 |
| Channel 28 | 1 | 10 | 27 | 68 |
| Channel 29 | 1 | 15 | 36 | 65 |
| Channel 30 | 1 | 15 | 36 | 65 |
| Channel 31 | 1 | 20 | 42 | 78 |
| Channel 32 | 1 | 20 | 42 | 78 |
| Channel 33 | 1 | 15 | 99 | 189 |
| Channel 34 | 1 | 15 | 99 | 189 |
| Channel 35 | 1 | 15 | 27 | 50 |
| Channel 36 | 1 | 15 | 27 | 50 |

With unconstrained electric current the average inhomogeneity reduction provided by the MCA over the whole cohort of patients was 35%, but currents higher than 600 A.turns appeared. Constraining the currents to 60 A.turns the performance dropped to 32%: a 3% drop in performance but a 90% reduction of the maximal current intensity. For the number of turns listed in table 1 and maximum currents obtained in constrained simulations, electric current per channel was limited to 3 A. Average power consumption was around 10 W. Even higher reduction of the field inhomogeneity can be obtained by increasing the number of layers (e.g. to 5), at least in front of the face and the ears of the patient, where most inohomogeneity-inducing anatomical features are located; moreover, space constraints are less severe there than at the back of the head.

It should be noticed that the higher brain map resolutions yield higher inhomogeneities as they capture the steep $\Delta B_0$ excursions more finely near the air cavities in the human head, so that shim performance is harder to achieve with high resolution maps. This emphasizes even more the preferable performances obtained using the invention.

Simulations for a 10-channel MCA obtained from the inventive method showed comparable performance to that of a 16-channel MCA with regularly distributed loops.

In addition, the 36-channel MCA of FIGS. 14A-J and table 1 (and even a simplified 25-channel version) outperforms the helmet shape MCA of [Stockmann 2018], comprising 40 channels.

In order to assess the technical advantage provided by the invention, a comparison has been performed between an optimized MCA according to the invention and a matrix MCA constituted by identical, circular loops uniformly distributed over a cylindrical surface.

To this aim, a 100-subject database of three-dimensional $\Delta B_0$ brain fieldmaps was built from 3 T acquisitions in a Siemens Magnetom Prisma (trademark) imager equipped with second-order SH shim coils at 1.7-mm isotropic resolution. The $\Delta B_0$ field intensities were rescaled to 7 T, since a shim system for UHF is intended. FSL's (FMRIB Software Library) brain extraction tool was used to exclude non-brain voxels.

All field maps were used as target fields, providing 100 stream functions upon which SVD were applied; then optimized loops according to the concentrated design were extracted from the three first principal modes, each loop being associated with a shimming channel. Three concentric cylindrical coil formers of equal length L=300-mm and radii $a_1$=140.5-mm, $a_2$=149.5-mm and $a_3$=158.5-mm accommodate the optimized loops extracted from first, second and third modes respectively. Single-turn models of each loop were exported to ANSYS-Maxwell (trademark) for the calculation of their complex impedance and of their magnetic field distribution in a region enclosing all brains. The loops were further assumed to be 20-turn windings of copper wire with 1-mm diameter to improve shimming efficiency with limited power supply. Loop current was constrained to 5 A. Each winding was assumed to yield the same normalized magnetic field profile as a single turn.

For comparison purposes, four different M-MCAs of 16, 24, 32 and 48 circular loop channels over cylindrical formers of 140.5-mm radius are designed with similar windings and current constraints.

For every subject, the shimming performance of each MCA was simulated by computing the electric currents minimizing the $L_2$ norm of the residual magnetic field in a region of interest (in this case, the whole brain). Finally, resulting inhomogeneity (standard deviation of the $\Delta B_0$ residual across all voxels of interest), inhomogeneity reduction and power dissipation were assessed.

The results are displayed on FIG. 15, where the leftmost bars represent the inhomogeneity reduction achieved using 16, 24, 32 and 48-channel matrix MCAs, and the rightmost bars the inhomogeneity reduction achieved using a 1-layer (1L)-16 channel, a 2-layer (2L)-28 channel and a 3-layer (3L)-39 channel optimized MCA according to the invention.

It can be seen that the inventive optimized MCAs (O-MCA) outperform matrix MCAs (M-MCA) in whole-brain shimming while having much smaller channel count. The 2-layer, 28-channel O-MCA shows slightly better inhomogeneity reduction, 30.9%(6.7), on the database than the 48-channel M-MCA, 28.3%(6.7), and much superior performance than the 23.5%(6.9) achieved by 32-channel M-MCA, a relative improvement of 31.5%.

Up to this point, only numerical results have been discussed. The invention, however, has also been tested experimentally, as discussed below.

For designing a prototype, a 100-subject database of three-dimensional $\Delta B_0$ brain field maps was built from 1.7-mm isotropic 3T acquisitions in a Siemens Magnetom Prisma (trademark) imager after global shimming with second-order SH coils. The $\Delta B_0$ field intensities were rescaled to 7 T, since a shim system for UHF was intended. FSL's brain extraction tool was used to exclude non-brain voxels, providing masks of 14.2 cm average foot-head length. Each field map was used as target field to calculate optimal stream functions upon which the SVD was applied. An optimized 13 loop array was extracted from the first SVD mode, each loop being associated with a shimming channel to be placed over a cylindrical coil former of length L=300-mm and radius a=140.5-mm. Single-turn models of the 13 loops were simulated in Ansys-Maxwell (trademark) to obtain estimated $\Delta B_0$ field maps and loop impedance. Expected global shimming performance over the database was computed using the simulated fields as shimming basis, considering now each loop with 20 turns to improve efficiency. Loops were made with 1-mm diameter copper wire in simulations and prototype.

The prototype was constructed by placing the 20-turn windings over an epoxy/fiberglass cylinder of 139.5-mm external radius and 4-mm thickness. The magnetic field maps for each channel at 1.5 A were acquired in a 198-mm-diameter cylindrical oil phantom on a MAGNETOM 7T Siemens scanner. Channel resistance was also measured for power dissipation estimations.

Agreement with predicted shim performance was assessed by inputting the measured fields per unit current as shimming basis for computational global shimming of the database.

Two M-MCAs of 16 and 24 twenty-turn circular loop channels over cylindrical formers of 140.5-mm were also simulated for comparison. Current amplitude was constrained to 3 A per channel in all shimming simulations and power dissipation is estimated for all systems.

On FIG. 16, the first two bars from the left show the simulated whole-brain inhomogeneity reduction obtained using 16-channel and 24-channel M-MCAs; the third and fourth bars, respectively, simulated and measured results for a 13-channel O-MCA and the fifth and sixth, respectively, simulated and measured results for a 24-channel O-MCA. It can be easily seen that simulations accurately predict the experimental results.

The invention has been described with reference to a number of possible implementations, but many variants are possible. For instance:

Other methods may be used for computing the stream functions. For instance, the Cartesian mesh discretization described with reference to FIGS. 2 and 3 may be replaced e.g. by a triangular mesh discretization, as in the Inverse Boundary Element Method—see [Poole 2007] and [Lemdiasov 2004]. Moreover, instead of minimizing a cost function which is a trade-off between power consumption and residual inhomogeneity, it would be possible to minimize residual inhomogeneity under power constraint, or to minimize dissipated power under a residual inhomogeneity constraint. More generally, depending on the specific application considered, it is possible to compute the stream functions:

- either by minimizing any cost function representative of residual inhomogeneity and possibly one or more electrical parameters of the coil system (dissipated power, inductance, resistance . . . ), the optimization being free or constrained;
- or by minimizing a function representative of one or more electrical parameters of the coil system (dissipated power, inductance, resistance . . . ) subject to a set of constraints including at least a performance (i.e. residual inhomogeneity) constraint.

For better performance, rather than addressing a general brain population, a coil system could be designed for specific human head categories (small vs big heads, Asian vs Caucasian head shapes, male vs female, etc). Otherwise stated, several cohorts of somehow similar subjects may be used for designing different, "semi-universal" coil systems, intended to be used for respective populations.

The coil system may be designed to address specific brain regions, such as the frontal lobe or temporal lobes exclusively, or even other body parts such as the heart or spine.

A hybrid, part-concentrated, part-distributed design is also possible—i.e. some, but not all, clusters of contour lines may be replaced by single looping paths.

Different windings, corresponding e.g. to different channels, may have different numbers of turns and/or wires of different gauges.

It is not always necessary that the wiring pattern corresponding to the $n^{th}$ SVD stream function is entirely supported by the $n^{th}$ coil former, and conversely that the $n^{th}$ coil former only supports the wiring pattern corresponding to the $n^{th}$ SVD stream function. Windings may be transferred from a coil former to another, as long as there are no collisions.

There may be empty space between the RF coil and the shim insert or not. Reducing the radius of the windings makes the system more efficient, because less current is needed.

It is possible to have more coil layer in front of some specific anatomical regions (e.g. face and ears) than in front of others (e.g. the back of the head).

Coil formers (and therefore reference surfaces) are not necessarily cylindrical. For instance it may be expedient to use flattened cylinder, the flattened part corresponding to the back of the head.

The invention has been described with reference to an application to 3D imaging, in particular of the brain, wherein whole-brain shimming is required. However, the inventive coil system is also suitable to other applications, such as dynamic shimming for slice-by-slice 2D imaging and spectroscopy. Moreover, the invention may also be useful at comparatively low magnetic field, e.g. 3 T.

REFERENCES

[Salomir 2003] Salomir R. et al, 2003. A Fast Calculation Method for Magnetifc Field Inhomogeneity due to an Arbitrary Distribution of Bulk Susceptibility, In: Concepts in Magn. Reson. 19B, p. 26.

[Juchem 2015] Juchem C. et al, 2014. Dynamic Multi-Coil Technique (Dynamite) Shimming for Echo-Planar Imaging of the Human Brain at 7 Teslas, In: NeuroImage 105, p. 462.

[Stockmann 2018] Stockmann J. P., Wald L. L., 2018. In vivo B0 shimming methods for MRI at 7 T, In: NeuroImage 168, p. 71.

[Kim 2016] T. Kim, Y. Lee, T. Zhao, H. P. Hetherington, J. W. Pan "Gradient-echo EPI using a high-degree shim insert coil at 7 T: implications for BOLD fMRI" Magn. Reson. Med. (2016).

[Vedrine 2014] P. Vedrine, G. Aubert, J. Belorgey, C. Berriaud, A. Bourquard, P. Bredy, A. Donati, O. Dubois, F. Elefant, G. Gilgrass, F. P. Juster, H. Lannou, F. Molinie, M. Nusbaum, F. Nunio, A. Payn, L. Quettier, T. Schild, L. Scola, and A. Sinanna, "Manufacturing of the Iseult/INUMAC Whole Body 11.7 T MRI Magnet", IEEE Transactions On Applied Superconductivity, Vol. 24, No. 3, June 2014.

[Windischberger 2004] C. Windischberger, S. Robinson, A. Rauscher, M. Barth, and E. Moser, Robust Field Map Generation Using a Triple-Echo Acquisition, Journal of Magnetic Resonance Imaging 20:730-734 (2004).

[Peeren 2003] Peeren G. N. et al, 2003. "Stream Function Approach for Determining Optimal Surface Currents", In: Journal of Computational Physics 191, p. 305.

[Poole 2007] M. Poole, R. Bowtell. "Novel gradient coils designed using a boundary element method". Concepts Magn. Reson., 31B, 2007; 162-175.

[Lemdiasov 2004] Lemdiasov, R. A. and Ludwig, R. (2005), A stream function method for gradient coil design. Concepts Magn. Reson., 26B: 67-80.

The invention claimed is:

1. A method of designing a static-magnetic-field shimming coil system (SCS) for magnetic resonance imaging, comprising the steps of:
    a) for each member of a cohort of magnetic resonance imaging subjects ($S_1$, $S_2$, $S_3$):
        a1) acquiring a map of a static magnetic field ($FM_1$, $FM_2$, $FM_3$) within a region of interest (ROI), common to all members, comprising a bodily portion (HH) of the member;
        a2) determining a corrective static magnetic field such that a sum of the acquired static magnetic field and the corrective static magnetic field is equal to a target static magnetic field within the region of interest;
        a3) determining a stream function (I, $I_1$, $I_2$, $I_3$, $I_4$), defined on a reference surface (RS, $RS_1$) enclosing the region of interest (ROI) and corresponding to a current density distribution on said surface, minimizing either a cost function representative at least of a difference between the corrective static magnetic field and a static magnetic field generated by said current density distribution, or a cost function representative at least of an electric parameter of the coil system subject to at least one constraint representative of said difference;
    b) performing a Principal Component Analysis of the stream functions determined for at least a plurality of members of the cohort; and
    c) determining at least one coil wiring pattern (WP1) defined on said reference surface (RS1) by discretizing at least a most significant principal component ($I_1^{SVD}$) of said stream functions;

steps a2), a3), b) and c) being carried out using a computer.

2. The method of claim 1, further comprising determining one or more additional coil wiring patterns ($WP_2$, $WP_3$, $WP_4$, $WP_5$) defined on additional surfaces, ($RS_2$, $RS_3$ $RS_4$, $RS_5$) disjoint from the reference surface and also enclosing the region of interest, by discretizing additional principal components ($I_2^{SVD}$, $I_3^{SVD}$, $I_4^{SVD}$, $I_5^{SVD}$) of said stream functions.

3. The method of claim 2, wherein said determining one or more additional coil wiring patterns comprises:
    repeating steps a3) and b) one or more times for different additional surfaces ($RS_2$, $RS_3$ $RS_4$, $RS_5$), disjoint from the reference surface ($RS_1$) and also enclosing the region of interest (ROI), and
    discretizing respective, different principal components ($I_2^{SVD}$, $I_3^{SVD}$, $I_4^{SVD}$, $I_5^{SVD}$) of the stream functions determined at each repetition so as to determine said one or more additional coil wiring patterns ($WP_2$, $WP_3$, $WP_4$, $WP_5$) on said additional surfaces.

4. The method of claim 2, wherein said determining one or more additional coil wiring patterns comprises:
    defining a three-dimensional closed surface sufficiently large to enclose regions of interest of all members of the cohort;
    for at least one said additional principal component ($I_2^{SVD}$, $I_3^{SVD}$, $I_4^{SVD}$, $I_5^{SVD}$) of said stream functions:
        computing the static magnetic field generated on the three-dimensional closed surface by a current density corresponding to said additional principal component;
        determining a stream function, defined on a corresponding additional surface ($RS_2$, $RS_3$ $RS_4$, $RS_5$), such that a corresponding current density would generate the computed static magnetic field on the three-dimensional closed surface; and
        discretizing said stream function so as to determine said additional coil wiring pattern ($WP_2$, $WP_3$, $WP_4$, $WP_5$) on said additional surface.

5. The method of claim 2, wherein the number of coil wiring patterns, each corresponding to a different principal component of stream functions and defined on a respective surface, is comprised between 2 and 10.

6. The method of claim 5, wherein the number of coil wiring patterns, each corresponding to a different principal component of stream functions and defined on a respective surface, is comprised between 3 and 7.

7. The method of claim 2, wherein said reference surface and said additional surfaces are cylindrical.

8. The method of claim 2, further comprising a step of simplifying said coil wiring pattern or patterns by identifying clusters of looping paths (SLP1, SLP2, SLP3, SLP4) surrounding a same single local extremum of the corresponding stream function and replacing the looping paths of each cluster by a wire winding (WW1) following a single looping path.

9. The method of claim 1, further comprising a step of simplifying said coil wiring pattern or patterns by identifying clusters of looping paths ($SLP_1$, $SLP_2$, $SLP_3$, $SLP_4$) surrounding a same single local extremum of the corresponding stream function and replacing the looping paths of each cluster by a wire winding ($WW_1$) following a single looping path.

10. The method of claim 9, wherein said single looping path coincides with an outermost looping path of the cluster.

11. The method of claim 9, further comprising modifying the simplified coil pattern or patterns by introducing electrical connections (EC) suitable for independently injecting a current into each wire winding.

12. The method of claim 11, further comprising the steps of:
- acquiring a map of a static magnetic field within a region of interest comprising a bodily portion of a magnetic resonance imaging subject;
- determining a corrective static magnetic field such that a sum of the acquired static magnetic field and the corrective static magnetic field is equal to the target static magnetic field; and
- for all looping paths or cluster of looping paths, determining a respective current intensity value such that a cost function representative of a difference between the corrective static magnetic field and a static magnetic field generated by injecting currents having said intensity values into the looping paths or clusters of looping paths is minimized.

13. The method of claim 1, further comprising a step of identifying clusters of looping paths surrounding a same single local extremum of the corresponding stream function and modifying the coil pattern or patterns by replacing the looping paths of said clusters by respective wire windings following said paths and by introducing electrical connections suitable for independently injecting a current into each cluster of looping paths and for connecting looping paths of a same cluster in series.

14. The method of claim 1, wherein said reference surface is cylindrical.

15. The method of claim 1, wherein said target static magnetic field has a component along a predetermined axis (z) which is uniform.

16. The method of claim 1, wherein, in step b), the principal component analysis of the stream functions is carried out using a Singular Value Decomposition algorithm.

17. The method of claim 1, further comprising a step of symmetrizing said or at least one said coil wiring pattern.

18. A method of manufacturing a static-magnetic-field shimming coil system (SCS) for magnetic resonance imaging, comprising:
- a step of designing said static-magnetic-field shimming coil system by applying a method according to claim 1; and
- a step of physically manufacturing the coil system as designed.

19. A method of manufacturing a static-magnetic-field shimming coil system (SCS) for magnetic resonance imaging, comprising:
- a step of designing said static-magnetic-field shimming coil system by applying a method according to claim 9; and
- a step of physically manufacturing the coil system as designed.

* * * * *